United States Patent [19]
Takanashi et al.

[11] Patent Number: 5,260,796
[45] Date of Patent: Nov. 9, 1993

[54] APPARATUS DETECTING DISTRIBUTION OF SURFACE POTENTIAL ON A MEDIUM HOLDING CHARGE LATENT IMAGE

[75] Inventors: Itsuo Takanashi, Kamakura; Shintaro Nakagaki, Fujisawa; Tsutou Asakura, Yokohama; Masato Furuya, Yokosuka; Hirohiko Shinonaga, Yokohama; Hiromichi Tai, Yokosuka, all of Japan

[73] Assignee: Victor Company of Japan, Ltd., Japan

[21] Appl. No.: 700,680

[22] Filed: May 15, 1991

Related U.S. Application Data

[62] Division of Ser. No. 347,642, May 5, 1989, Pat. No. 5,065,102.

[30] Foreign Application Priority Data

| | | |
|---|---|---|
| May 10, 1988 [JP] | Japan | 63-113305 |
| May 27, 1988 [JP] | Japan | 63-129847 |
| Jul. 25, 1988 [JP] | Japan | 63-185101 |

[51] Int. Cl.⁵ .................. H04N 3/14; H04N 5/335
[52] U.S. Cl. ........................................ 358/213.11
[58] Field of Search ............... 358/213.11, 213.12, 358/213.29

[56] References Cited

U.S. PATENT DOCUMENTS

| | | | |
|---|---|---|---|
| 3,590,343 | 6/1971 | Nathanson et al. | 357/14 |
| 3,828,256 | 8/1974 | Liu | 324/72.5 |
| 4,032,975 | 6/1977 | Malueg et al. | 358/213.11 |
| 4,084,134 | 4/1978 | Nagano | 324/72.5 |
| 4,150,389 | 4/1979 | Roessler | 357/13 |
| 4,330,749 | 5/1982 | Eda et al. | 324/457 |
| 4,423,371 | 12/1983 | Senturia et al. | 324/61 R |
| 4,587,426 | 5/1986 | Munier et al. | |
| 4,612,454 | 9/1986 | Kinoshita et al. | |
| 4,628,352 | 12/1986 | Boue | |
| 4,646,002 | 2/1987 | Tuszyski | 324/72.5 |
| 4,786,971 | 11/1988 | Kaneko et al. | |
| 5,018,018 | 5/1991 | Takanashi et al. | 358/213.11 |

FOREIGN PATENT DOCUMENTS

| | | |
|---|---|---|
| 0143047 | 5/1985 | European Pat. Off. |
| 0176389 | 4/1986 | European Pat. Off. |
| 2011575 | 10/1970 | Fed. Rep. of Germany |
| 3434542A | 4/1986 | Fed. Rep. of Germany ...... 324/457 |
| 3712473 | 10/1987 | Fed. Rep. of Germany |
| 59-25269 | 2/1984 | Japan |
| 59-204771 | 11/1984 | Japan ................... 324/72.5 |
| 60-120267 | 6/1985 | Japan ................... 324/457 |
| 1253325 | 11/1971 | United Kingdom |
| 2140649 | 11/1984 | United Kingdom |
| 2155730 | 9/1985 | United Kingdom |

OTHER PUBLICATIONS

H. L. Maddox, "High Input Impedance Capacitance Coupled Voltage Probes," *Western Electric* No. 45 (Jan. 1977), pp. 27–29.

König. "Neue Entwicklungen bei Halbletter-Bilsensoren," *Fernseh- und Kino-Technik*, 39th Ed., No. 1/1985, pp. 6–10 (no translation).

Shirae et al., "A CCD Image sensor and microcomputer make magnetic domain observation clear and convenient", *J. Appl. Phys.*, No. 53(11), Nov. 1982, pp. 8380–8382.

*Primary Examiner*—Walter E. Snow
*Attorney, Agent, or Firm*—Lowe, Price, LeBlanc & Becker

[57] ABSTRACT

A voltage is electrostatically induced at a sensing device in correspondence with a surface potential of a measured object. In the case where the sensing device uses a field effect transistor in transferring detected information, there are some factors decreasing the accuracy of detection. Various new arrangements prevent such decreases in the accuracy of detection. In the case of the surface potential of the measured object corresponds to an optical image, new arrangements ensure accurate detection of the optical image. In some cases, color component signals are obtained on the basis of a detection signal.

6 Claims, 18 Drawing Sheets

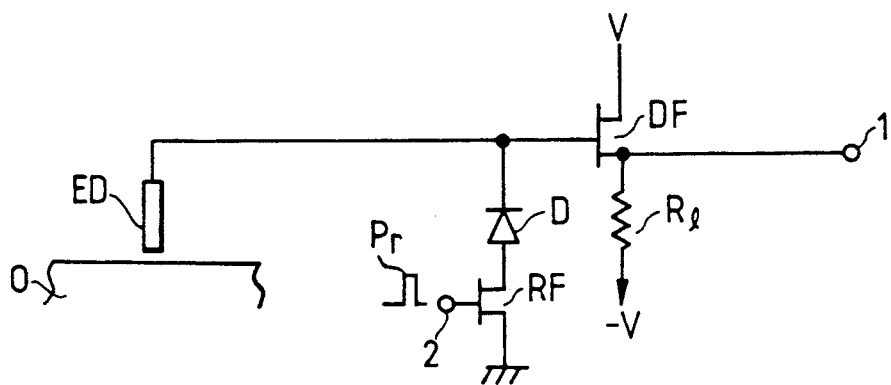
FIG. 1
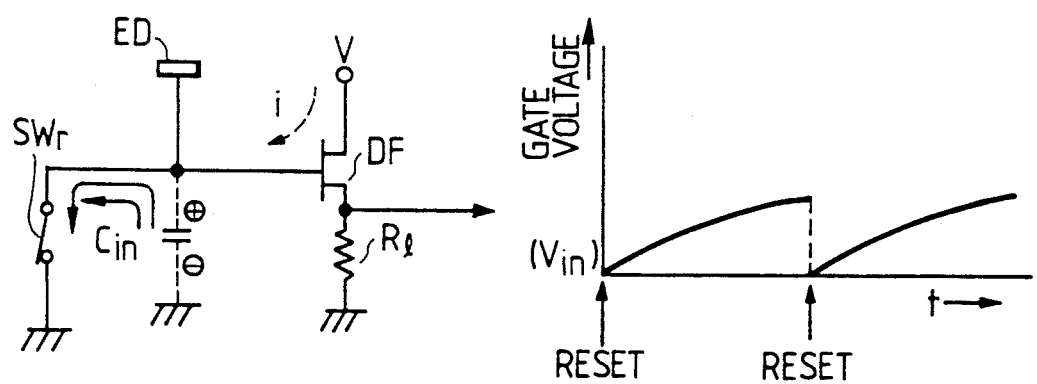
FIG. 2
FIG. 3
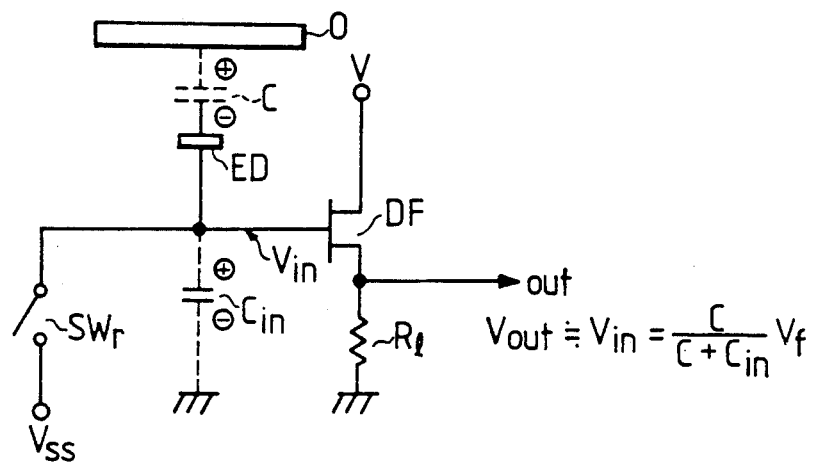
FIG. 4
$$V_{out} \doteq V_{in} = \frac{C}{C+C_{in}} V_f$$

(a)

(b)

(c)

APPARATUS DETECTING DISTRIBUTION OF SURFACE POTENTIAL ON A MEDIUM HOLDING CHARGE LATENT IMAGE

This application is a division of application Ser. No. 07/347,642 filed on May 5, 1989 now U.S. Pat. No. 5,065,102.

BACKGROUND OF THE INVENTION

This invention relates to an apparatus for detecting the distribution of an electric surface potential and generating an electric signal representative of the detected potential distribution.

In some image pickup systems, a photoelectric transducing section enables a charge storage member to be charged in accordance with an optical image of an object. The distribution of an electric surface potential of the charge storage member represents the optical image. For example, a surface potential sensor of an electrostatic induction type is usable in detecting the distribution of such an electric surface potential and generating a corresponding electric signal.

Since the sensing section of such a surface potential sensor has a very high impedance, an impedance converter is generally connected to an output terminal of the sensing section. In the case where the impedance converter uses a field effect transistor, a leakage current from the drain to the gate of the transistor tends to cause an adverse effect such as an inaccuracy in the sensor output signal.

SUMMARY OF THE INVENTION

It is an object of this invention to provide an excellent apparatus for detecting the distribution of an electric surface potential.

A first apparatus of this invention comprises a field effect transistor having a gate and a drain; a gate input capacitance connected to the gate of the transistor and being charged by a leakage current between the drain and the gate of the transistor; means for subjecting the gate of the transistor to a voltage electrostatically induced in correspondence with a surface potential of a measured object; means for discharging the input capacitance to reset a voltage of the gate of the transistor; and a diode connected between the gate of the transistor and the discharging means and having a polarity opposing a discharging current from the input capacitance.

A second apparatus of this invention comprises a detecting field effect transistor having a gate and a drain; a first gate input capacitance connected to the gate of the detecting transistor and being charged by a leakage current between the drain and the gate of the detecting transistor; means for subjecting the gate of the detecting transistor to a voltage electrostatically induced in correspondence with a surface potential of a measured object; means for discharging the gate input capacitance of the detecting transistor to reset a voltage of the gate of the detecting transistor; a compensating field effect transistor having a gate and a drain; a second gate input capacitance connected to the gate of the compensating transistor and being charged by a leakage current between the drain and the gate of the compensating transistor; and means for discharging the gate input capacitance of the compensating transistor to reset a voltage of the gate of the compensating transistor in synchronism with the discharging of the input capacitance of the detecting transistor; wherein the detecting transistor outputs a signal having a first component and a second component related and unrelated to the surface potential of the measured object respectively, and the compensating transistor outputs a signal which equals the second component of the output signal from the detecting transistor.

A third apparatus of this invention comprises a plurality of sensing electrodes arranged in a line and subjected to voltages electrostatically induced in correspondence with a surface potential of a measured object; a plurality of field effect transistors having gates connected to the sensing electrodes respectively, the transistors having drains; gate input capacitances connected to the respective gates of the transistors and being charged by leakage currents between the drains and the gates of the transistors respectively; means for sequentially transferring output signals from the transistors to a common output line to obtain a time series output signal; means for discharging the gate input capacitances to reset voltages of the gates of the transistors each time one cycle of the sequential transfer of the output signals from the transistors is completed; a memory; an adder adding an output signal from the memory and one block of the time series output signal which corresponds to one cycle of the sequential transfer of the output signals from the transistors; and means for updating contents of the memory by an output signal from the adder.

A fourth apparatus of this invention comprises a sensing electrode subjected to a voltage electrostatically induced in correspondence with a surface potential of a measured object; a field effect transistor having a gate connected to the sensing electrode, the transistor having a drain; a gate input capacitance connected to the gate of the transistor and being charged by a leakage current between the drain and the gate of the transistor; means for periodically moving the sensing electrode toward and away from the measured object; and means for discharging the gate input capacitance to reset a voltage of the gate of the transistor at a timing dependent on the periodical movement of the electrode.

A fifth apparatus of this invention comprises a sensing electrode subjected to a voltage electrostatically induced in correspondence with a surface potential of a measured object; a field effect transistor having a gate connected to the sensing electrode, the transistor having a drain; a gate input capacitance connected to the gate of the transistor and being charged by a leakage current between the drain and the gate of the transistor; means for periodically moving the sensing electrode between a first position and a second position close to and remote from the measured object respectively; means for discharging the gate input capacitance to reset a voltage of the gate of the transistor each time the sensing electrode is in the first position; means for transferring an output signal from the transistor to an output terminal to enable a detection each time the sensing electrode is in the first position; means for discharging the gate input capacitance to reset the voltage of the gate of the transistor each time the sensing electrode is in the second position; and means for transferring the output signal from the transistor to the output terminal to enable a detection each time the sensing electrode is in the second position.

A sixth apparatus of this invention comprises a plurality of sensing electrodes arranged in a line and subjected to voltages electrostatically induced in correspondence with a surface potential of a measured object which represents an optical image, the sensing electrodes scanning the measured object; means for sequentially transferring output signals from the sensing electrodes to a common output line to obtain a time series output signal corresponding to one scanning line; a reference member subjected to a surface potential corresponding to a black portion of the optical image, the reference member being scanned by the sensing electrodes; means for storing the output signal as a reference signal when the reference member is scanned by the sensing electrodes; and means for reading the reference signal and subtracting the reference signal from the output signal when the measured object is scanned by the sensing electrodes.

A seventh apparatus of this invention comprises a floating gate field effect transistor having a gate; means for electrostatically inducing a voltage in correspondence with a surface potential of a measured object; means for applying the induced voltage to the gate of the transistor; and means for transferring an output signal from the transistor.

An eighth apparatus of this invention comprises a recording medium; means for generating a charge latent image of an object on the recording medium; a color filter disposed between the recording medium and the object; a sensing electrode; means for electrostatically inducing a voltage at the sensing electrode in correspondence with the latent image on the recording medium; means for generating an image signal on the basis of the voltage at the sensing electrode; means for enabling the sensing electrode to scan the recording medium; and means for deriving component color signals from the image signal.

A ninth apparatus of this invention comprises a recording medium; means for generating a plurality of charge latent images of an object on respective different regions of the recording medium, the charge latent images corresponding to different color images of the object respectively; a sensing electrode; means for electrostatically inducing a voltage at the sensing electrode in correspondence with the latent images on the recording medium; means for generating an image signal on the basis of the voltage at the sensing electrode; means for enabling the sensing electrode to scan the recording medium; and means for deriving component color signals from the image signal.

BRIEF DESCRIPTION OF THE DRAWINGS

FIG. 1 is a schematic diagram of an apparatus according to a first embodiment of this invention.

FIG. 2 is a schematic diagram explanatory of an operation of the apparatus of the first embodiment.

FIG. 3 is a diagram showing a time-dependent variation in the voltage of the detecting transistor of the apparatus of FIGS. 1 and 2.

FIG. 4 is a schematic diagram explanatory of an operation of the apparatus of the first embodiment.

Like and corresponding elements are denoted by the same reference characters throughout the drawings.

DESCRIPTION OF THE FIRST PREFERRED EMBODIMENT

Figure 5:
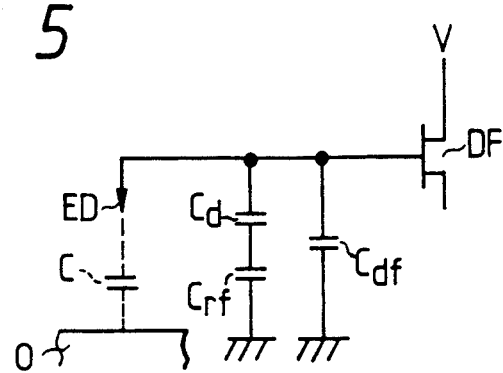
FIG. 5 is an equivalent circuit of the apparatus of the first embodiment.

With reference to FIG. 1, an apparatus according to a first embodiment of this invention includes a sensing electrode ED closely opposing a measured object O. The sensing electrode ED is connected to the gate of a detecting field effect transistor DF and the cathode of a diode D. The anode of the diode D is connected to the drain of a switching field effect transistor RF.

The source of the switching transistor RF is grounded. The gate of the switching transistor RF is subjected to a reset pulse signal Pr via a terminal 2. The reset pulse signal Pr includes a train of positive going pulses.

The drain of the detecting transistor DF is connected to a positive power supply line V. The source of the detecting transistor DF is connected to one end of a load resistor Rl and an output terminal 1. The other end of the load resistor Rl is connected to a negative power supply line −V.

During the detection of a surface potential of the measured object O, the sensing electrode ED is placed at a position near a surface of the measured object O. A voltage depending on the surface potential of the measured object O is induced at the sensing electrode ED via electrostatic induction. The induced voltage is transmitted from the sensing electrode ED to the gate of the detecting transistor DF. The detecting transistor DF functions as an impedance down-converter. A potential at the source of the detecting transistor DF which depends on the induced voltage is applied to the output terminal 1 as a detection signal which represents the surface potential of the measured object O.

In cases where the sensing electrode ED is moved relative to the measured object O to scan the surface of the measured object O, the detection signal which appears at the output terminal 1 varies in accordance with the distribution of the surface potential of the measured object.

As will be made clear hereinafter, the switching transistor RF serves as a resetting device which prevents an adverse effect by a leakage current from the drain to the gate of the detecting transistor DF. Specifically, the switching transistor RF periodically shunts the gate of the detecting transistor DF to the ground in response to the reset pulse signal Pr.

As shown in FIG. 2, the gate of the detecting transistor DF has a stray capacitance Cin with respect to the ground. A leakage current "1" from the drain to the gate of the detecting transistor DF charges the capacitance Cin, thereby increasing the voltage of the gate of the detecting transistor DF. The switching transistor RF forms a switch SWr connected across the capacitance Cin. The switch SWr periodically discharges the capacitance Cin in response to the reset pulse signal Pr, so that the voltage at the gate of the detecting transistor DF is periodically reset to the ground potential as shown in FIG. 3. The reset pulse signal Pr preferably has a predetermined frequency.

As shown in FIG. 4, a capacitance C is formed between the sensing electrode ED and the surface of the measured object O which surface is opposite to the electrode ED and has an electric charge. In the case where the surface potential of the measured object O has a level Vf, the output voltage Vout at the source of the detecting transistor DF is approximately equal to the input voltage Vin at the gate of the detecting transistor DF which is expressed by the following equation.

$$Vin = \{C/(C+Cin)\} \cdot Vf.$$

The provision of the switch SWr would cause an increased input capacitance Cin at the gate of the detecting transistor DF. As understood from the previously-mentioned equation, the increased input capacitance would result in a decreased input voltage Vin and thus a decreased output voltage. Accordingly, it is preferable to prevent an increase in the input capacitance Cin which would be caused by the provision of the switch SWr. As will be made clear hereinafter, the diode D suppresses or prevents such an unacceptable increase in the input capacitance.

As shown in FIG. 5, the detecting transistor DF has its own gate input capacitance Cdf. The switching transistor RF has a capacitance Crf between its drain and source. The diode D has a capacitance Cd with respect to a reverse current. The capacitances Cd and Crf are connected in series. The series combination of the capacitances Cd and Crf is connected across the capacitance Cdf. The combination of the capacitances Cdf, Cd, and Crf forms an input capacitance Cin. Since the capacitance Cd is very small, the resultant of the capacitances Cd and Crf is also extremely small regardless of the capacitance Crf so that the provision of the switching transistor RF causes only a negligibly small increase in the input capacitance Cin.

The diode D is connected relative to the input capacitance Cin so that the polarity of the diode D opposes a discharge current from the input capacitance Cin. Accordingly, the diode D offers a great resistance to the discharge current. This resistance determines a time constant of the discharge of the input capacitance Cin in conjunction with the value of the input capacitance Cin. Although this resistance is great, the value of the input capacitance Cin is small so that the time constant of the discharge is also small. The small time constant ensures a quick resetting of the input voltage Vin to the ground potential.

DESCRIPTION OF THE SECOND PREFERRED EMBODIMENT

Figure 6:
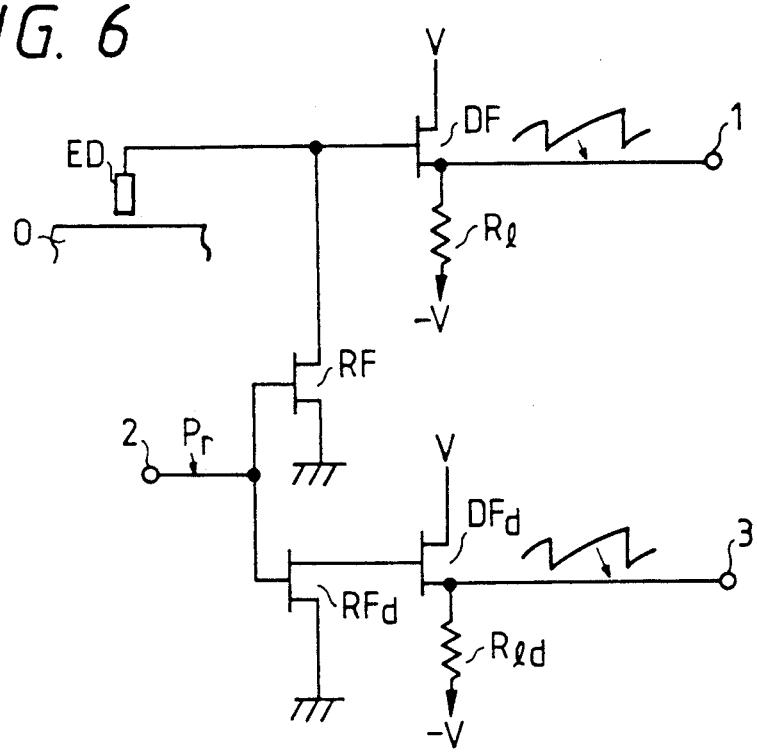
FIG. 6 is a schematic diagram of an apparatus of a second embodiment of this invention.

With reference to FIG. 6, an apparatus according to a second embodiment of this invention includes a sensing electrode ED closely opposing a measured object O. The sensing electrode ED is connected to the gate of a detecting field effect transistor DF and the drain of a switching field effect transistor RF.

The source of the switching transistor RF is grounded. The gate of the switching transistor RF is subjected to a reset pulse signal Pr via a terminal 2.

The reset pulse signal Pr is also applied to the gate of a switching field effect transistor RFd via the terminal 2. The source of the switching transistor RFd is grounded. The drain of the switching transistor RFd is connected to the gate of a compensating field effect transistor DFd.

The drain of the detecting transistor DF and the drain of the compensating transistor DFd are connected to a positive power supply line V. The source of the detecting transistor DF is connected to one end of a load resistor Rl and an output terminal 1. The other end of the load resistor Rl is connected to a negative power supply line −V. The source of the compensating transistor DFd is connected to one end of a load resistor Rld and an output terminal 3. The other end of the load resistor Rld is connected to the negative power supply line −V.

During the detection of a surface potential of the measured object O, the sensing electrode ED is placed at a position near a surface of the measured object O. A voltage depending on the surface potential of the measured object O is induced at the sensing electrode ED via electrostatic induction. The induced voltage is transmitted from the sensing electrode ED to the gate of the detecting transistor DF. The detecting transistor DF functions as an impedance down-converter. A potential at the source of the detecting transistor DF which depends on the induced voltage is applied to the output terminal 1 as a detection signal which represents the surface potential of the measured object O.

In cases where the sensing electrode ED is moved relative to the measured object O to scan the surface of the measured object O, the detection signal which appears at the output terminal 1 varies in accordance with the distribution of the surface potential of the measured object.

As will be made clear hereinafter, the switching transistor RF serves as a resetting device which prevents an adverse effect by a leakage current from the drain to the gate of the detecting transistor DF. Specifically, the switching transistor RF periodically shunts the gate of the detecting transistor DF to the ground in response to the reset pulse signal Pr.

The gate of the detecting transistor DF has an input stray capacitance with respect to the ground. A leakage current from the drain to the gate of the detecting transistor DF charges the input capacitance, thereby increasing the voltage of the gate of the detecting transistor DF. The switching transistor RF forms a switch connected across the input capacitance. This switch periodically discharges the input capacitance in response to the reset pulse signal Pr, so that the voltage at the gate of the detecting transistor DF is periodically reset to the ground potential. As shown in FIG. 7(a), the output voltage which is applied from the source of the detecting transistor DF to the output terminal 1 periodically increases from and returns to a minimum reference potential in correspondence with the periodical variation in the gate voltage of the detecting transistor DF. The output voltage which appears at the output terminal 1 has components representative of the surface potential of the measured object. The reset pulse signal Pr preferably has a predetermined frequency.

The gate of the compensating transistor DFd has an input stray capacitance with respect to the ground as the gate of the detecting transistor DF has. A leakage current from the drain to the gate of the compensating transistor DFd charges the input capacitance, thereby increasing the voltage of the gate of the compensating transistor DFd. The switching transistor RFd forms a switch connected across the input capacitance of the compensating transistor DFd. This switch periodically discharges the input capacitance in response to the reset pulse signal Pr, so that the voltage at the gate of the compensating transistor DFd is periodically reset to the ground potential. As shown in FIG. 7(b), the output voltage which is applied from the source of the compensating transistor DFd to the output terminal 3 periodically increases from and returns to a minimum reference potential in correspondence with the periodical variation in the gate voltage of the compensating transistor DFd.

Figure 7:
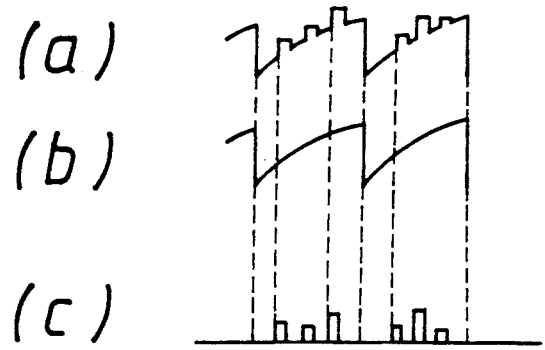
FIG. 7 is a timing diagram showing the waveforms of signals in the apparatus of the second embodiment.

As shown in FIG. 7, the output signals, which appear at the output terminals 1 and 3 respectively, are synchronous with each other and are similar in waveform but are different from each other in that the output signal at the output terminal 3 does not have any components representative of the surface potential of the measured object O. Accordingly, in cases where a voltage subtracter or a differential amplifier (not shown) is used to derive a difference between the output voltages at the output terminals 1 and 3, components purely representative of the surface potential of the measured object O are extracted from the output signals at the output terminals 1 and 3 as shown in FIG. 7(c).

DESCRIPTION OF THE THIRD PREFERRED EMBODIMENT

Figure 8:
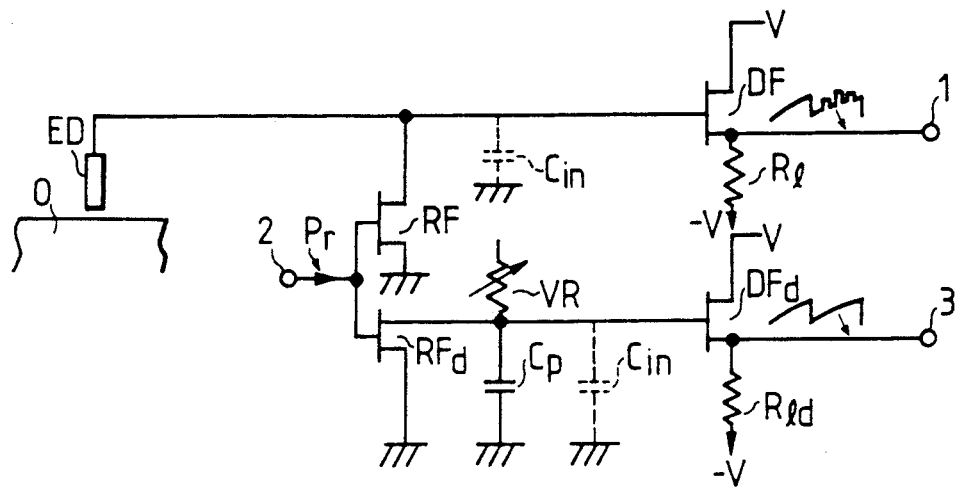
FIG. 8 is a schematic diagram of an apparatus of a third embodiment of this invention.

FIG. 8 shows a third embodiment of this invention which is similar to the embodiment of FIGS. 6 and 7 except for the design changes indicated hereinafter.

In the embodiment of FIG. 8, a capacitor Cp is connected between the gate of the compensating transistor DFd and the ground. In addition, a variable resistor VR is connected between the gate of the compensating transistor DFd and the positive power supply line V.

The variable resistor VR is adjusted so that the time constant of the charging and discharging of the input capacitance related to the compensating transistor DFd can be exactly the same as that related to the detecting transistor DF. This design equalizes the operating characteristics of the compensating transistor DFd and the detecting transistor DF, enabling accurate detection of the signal components representative of the surface potential of the measured object O.

DESCRIPTION OF THE FOURTH PREFERRED EMBODIMENT

Figure 9:
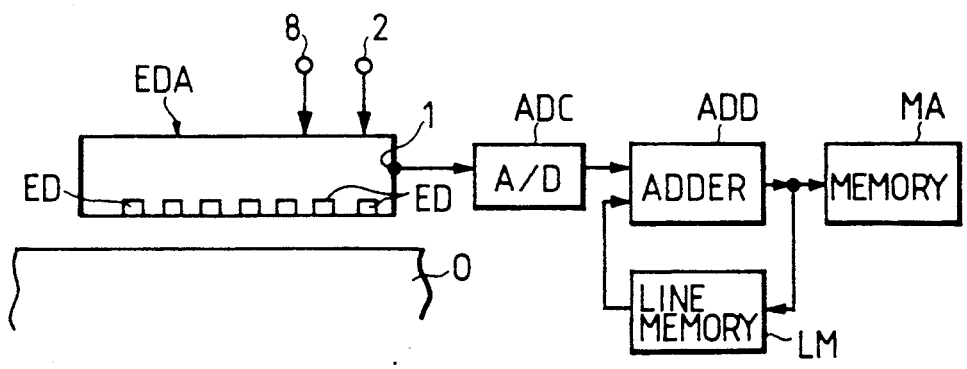
FIG. 9 is a schematic diagram of an apparatus of a fourth embodiment of this invention.

With reference to FIG. 9, an apparatus according to a fourth embodiment of this invention includes a sensing head EDA which has a plurality of sensing electrodes ED arranged in a predetermined pattern. An output signal from the sensing head EDA is fed to an analog-to-digital converter ADC via an output terminal 1 thereof. During the operation of the apparatus, the sensing head EDA is made close to a measured object O so that the arrangement of the sensing electrodes ED opposes a surface of the measured object O.

An adder ADD adds output signals from the converter ADC and a line memory LM. An output signal from the adder ADD is stored into the line memory LM and a memory MA.

Figure 10:
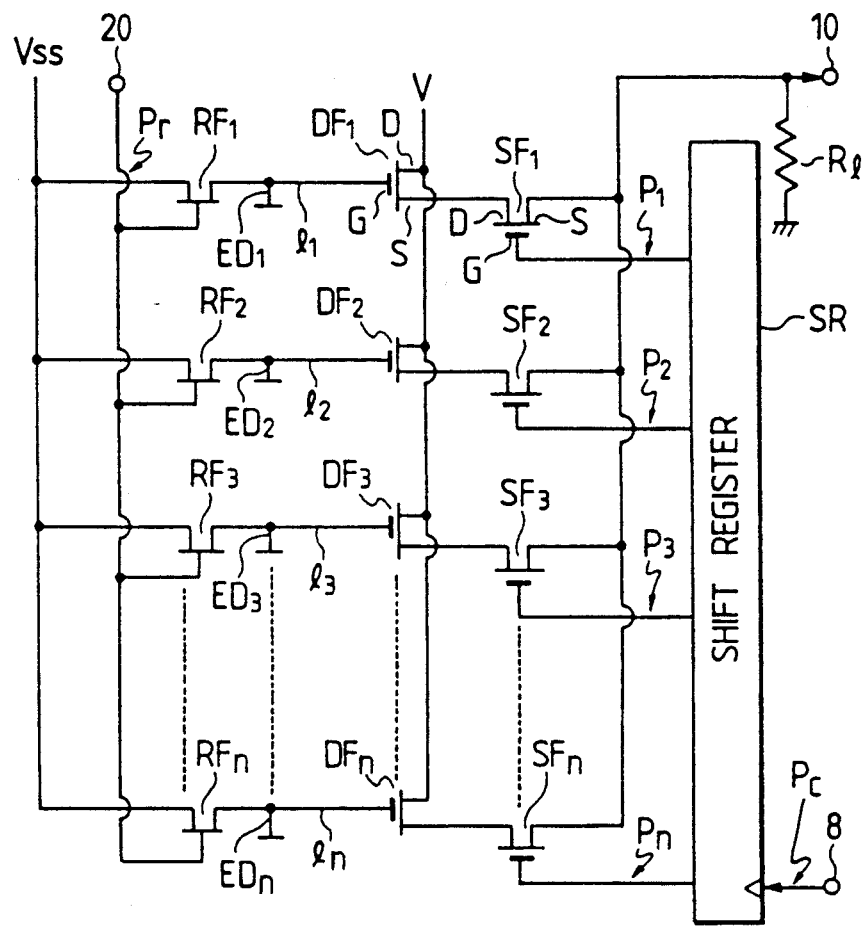
FIG. 10 is a diagram of the sensing head of FIG. 9.

As shown in FIG. 10, the sensing head EDA includes sensing electrodes ED1-EDn which are connected to the gates of detecting transistors DF1-DFn via connection lines 11-ln respectively. The sensing electrodes ED1-EDn are also connected to the drains of switching transistors RF1-RFn respectively.

The gates of the switching transistors RF1-RFn are connected in common to an input terminal 2 subjected to a reset pulse signal Pr. The reset pulse signal Pr includes a train of negative going pulses. The sources of the switching transistors RF1-RFn are connected in common to a reference power supply line Vss.

The drains of the detecting transistors DF1-DFn are connected in common to a power supply line V. The sources of the detecting transistors DF1-DFn are connected to the drains of switching transistors SF1-SFn respectively. The sources of the switching transistors SF1-SFn are connected in common to the output terminal 1. A load resistor Rl is connected between the output terminal 1 and the ground.

The switching transistors SF1-SFn serve as switches connecting and disconnecting the detecting transistors DF1-DFn to and from the output terminal 1. In each of the switching transistors SF1-SFn, the source-drain path is made conductive and nonconductive when the gate receives a high level voltage and a low level voltage respectively. In other words, each of the switching transistors SF1-SFn is made on and off when its gate receives a high level voltage and a low level voltage respectively.

The gates of the switching transistors SF1-SFn are connected to respective output terminals of a shift register SR and are thus subjected to output signals P1-Pn from the shift register SR. A clock terminal of the shift register SR receives a clock signal Pc via a clock input terminal 8, the clock signal Pc taking a waveform as shown in FIG. 11.

Figure 11:
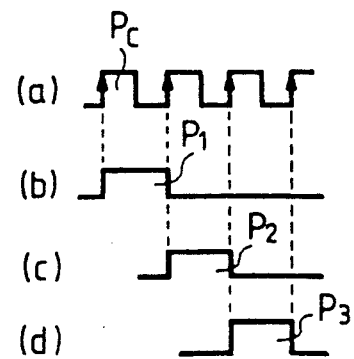
FIG. 11 is a timing diagram showing the waveforms of signals in the sensing head of FIG. 10.

As shown in FIG. 11, the output signals P1-Pn from the shift register SR sequentially assume high levels in response to the input clock signal Pc. Accordingly, the switching transistors SF1-SFn are sequentially made on in accordance with the clock signal Pc.

Figure 12:
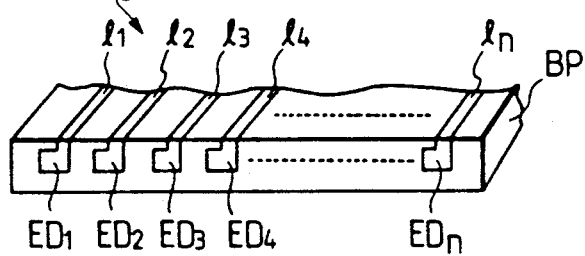
FIG. 12 is a perspective view of part of the sensing head of FIGS. 9 and 10.

As shown in FIG. 12, the sensing head EDA includes a substrate BP on which the sensing electrodes ED1-EDn and the connection lines l1-ln are formed. The sensing electrodes ED1-EDn are arranged in a line.

The apparatus operates as follows. The sensing head EDA is made close to the measured object O. In addition, the sensing electrodes ED1-EDn are opposed to the surface of the measured object O. Electrostatic induction allows the sensing electrodes ED1-EDn to be subjected to voltages corresponding to surface potentials of portions of the measured object O which oppose the sensing electrodes ED1-EDn respectively. The induced voltages are transmitted from the sensing electrodes ED1-EDn to the gates of the detecting transistors DF1-DFn via the connection lines l1-ln respectively.

As described previously, the switching transistors SF1-SFn are sequentially made on. Accordingly, voltage signals corresponding to the voltages of the gates of the detecting transistors DF1-DFn are sequentially transmitted from the sources of the detecting transistors DF1-DFn to the output terminal 1 via the source-drain paths of the switching transistors SF1-SFn. Thus, an output signal generated at the output terminal 1 has a time-dependent variation which corresponds to the distribution of the surface potential of the linear portion of the measured object.

Figure 13:
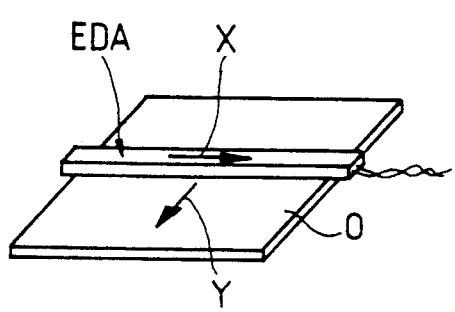
FIG. 13 is a perspective view of the sensing head and the measured object of FIG. 9.

After the transmission of the voltage signals from the detecting transistors DF1-DFn to the output terminal 1 is completed, that is, after the scan of the linear portion of the measured object O is completed, the reset pulse signal Pr makes the switching transistors RF1-RFn conductive so that the voltages of the sensing electrodes ED1-EDn and the gates of the detecting transistors DF1-DFn are reset to the reference voltage Vss. Then, a suitable drive mechanism (not shown) moves the sensing head EDA relative to the measured object O by a predetermined distance in a direction Y perpendicular to the direction X of the line of the sensing electrodes ED1-EDn as shown in FIG. 13. In other words, the sensing head EDA is moved to a position corresponding to a subsequent linear portion of the measured object O which is close and parallel to the previous linear portion of the measured object O. Then, the subsequent linear portion of the measured object O is scanned in a manner similar to the scan of the previous linear portion of the measured object. Specifically, the switching transistors SF1-SFn are sequentially driven so that voltage signals are sequentially transmitted from the detecting transistors DF1-DFn to the output terminal 1 in a manner similar to the previously mentioned case. Then, the switching transistors RF1-RFn are made conductive so that the voltages of the sensing electrodes ED1-EDn and the gates of the detecting transistors DF1-DFn are reset to the reference voltage Vss.

Such processes are periodically reiterated until an effective surface of the measured object O is scanned completely. During the scan of the surface of the measured object O, the output signal which is generated at the output terminal 1 exhibits a time-dependent variation corresponding to the distribution of the potential at the surface of the measured object O.

Figure 14:
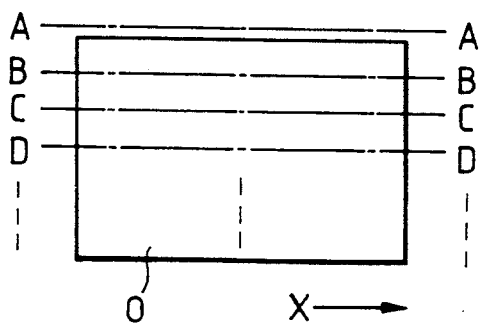
FIG. 14 is a plan view of the measured object of FIG. 9.

In FIG. 14, the letters "A", "B", "C", and "D" denote lines corresponding to positions which are sequentially occupied by the sensing head EDA during the movement of the sensing head EDA relative to the measured object O.

In each of the detecting transistors DF1-DFn, a leakage current from the drain to the gate of the transistor would cause an adverse effect on the detection signal representative of the surface potential of the measured object as in the embodiment of FIGS. 1-5. The switching transistors RF1-RFn periodically reset the voltages of the gate of the detecting transistors DF1-DFn to the reference voltage Vss in response to the reset pulse signal Pr, so that such leakage currents are prevented from adversely affecting the detection signals representative of the surface potentials of the measured object.

Figure 15:
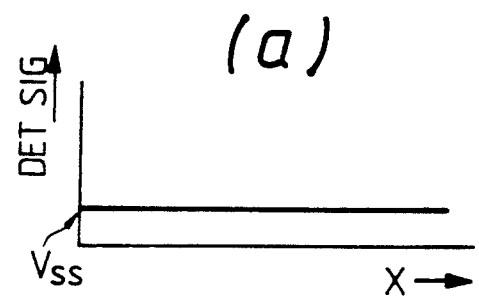
FIG. 15 is a diagram showing the waveforms of detection signals in the apparatus of the fourth embodiment.
Figure 15:
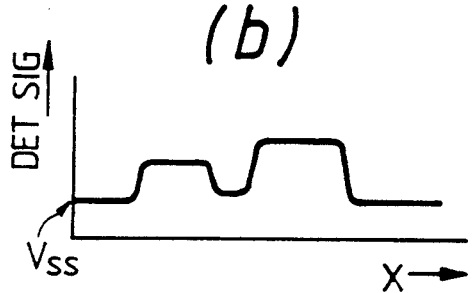
Figure 15:
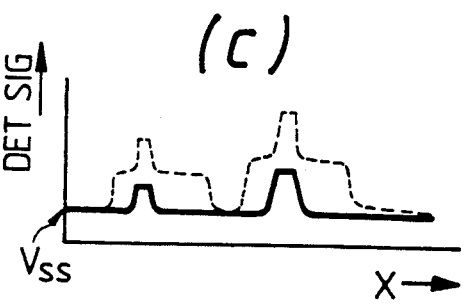

FIG. 15(b) shows an example of the waveform of the detection output voltage which occurs when the measured object O is scanned along the line B of FIG. 14. The solid line of FIG. 15(c) denotes the waveform of the detection output voltage which occurs when the measured object O is scanned along the subsequent line C of FIG. 14. The broken line of FIG. 15(c) denotes the actual distribution of the surface potential of the measured object O along the line C of FIG. 14. As understood from FIG. 15, the detection output voltage represents the difference between the surface potentials at two adjacent linear portions of the measured object O.

The operation of the apparatus will be further described hereinafter in one example case. While the sensing head EDA scans a region outside the measured object O along the line A of FIG. 14, the detection output voltage remains at the reference voltage Vss as shown in FIG. 15(a). The detection output voltage is converted by the converter ADC into a corresponding digital detection signal fed to the adder ADD. The adder ADD adds the digital detection signal and a digital signal read out from the line memory LM. An output digital signal from the adder ADD is stored into the memory MA and the line memory LM. In cases where the line memory LM is cleared or reset before the scanning along the line A starts, the digital detection signal corresponding to the waveform of FIG. 15(a) is directly stored into the memory MA.

The scanning along the line B of FIG. 14 is started after the scanning along the line A of FIG. 14 is completed. During the scanning along the line B of FIG. 14, the detection output voltage varies in a waveform as shown in FIG. 15(b). The detection output voltage is converted by the converter ADC into a corresponding digital detection signal fed to the adder ADD. The adder ADD adds the current digital detection signal and the previous digital detection signal which is read out from the line memory LM and which corresponds to the waveform of FIG. 15(a). An output digital signal from the adder ADD is stored into the memory MA and the line memory LM. The output digital signal from the adder ADD corresponds to the addition of the current digital detection signal and the previous digital detection signal.

The scanning along the line C of FIG. 14 is started after the scanning along the line B of FIG. 14 is completed. During the scanning along the line C of FIG. 14, the detection output voltage varies in a waveform as shown in FIG. 15(c). The detection output voltage is converted by the converter ADC into a corresponding digital detection signal fed to the adder ADD. The adder ADD adds the current digital detection signal and the previous output digital signal which is read out from the line memory LM and which corresponds to the waveform of FIG. 15(b). An output digital signal from the adder ADD is stored into the memory MA and the line memory LM. The output digital signal from the adder ADD corresponds to the addition of the current digital detection signal and the previous output digital signal.

Such processes are periodically reiterated until the effective surface of the measured object O is completely scanned.

As understood from the previous description, although the original detection signal which appears at the output terminal 1 represents the difference between the surface potentials at two adjacent linear portions of the measured object O, the combination of the devices ADC, ADD, and LM processes the original detection signal and thereby derives a desirable detection signal which directly represents the surface potential at one linear portion of the measured object O. The desirable detection signal is stored into the memory MA for later use.

It should be noted that the embodiment of FIGS. 9-15 may be modified in various ways. In a first modification, the connection lines 11-ln are surrounded by electrostatic shields to prevent the voltages of the gates of the detecting transistors DF1-DFn from fluctuating in response to an external electric field. In a second modification, the sensing electrodes ED1-EDn are separated from each other by electrostatic shields to prevent or suppress crosstalks between the detection signals induced at the adjacent sensing electrodes ED1-EDn. In a third modification, the sensing electrodes ED1-EDn are omitted and the gates of the detecting transistors DF1-DFn are designed to serve as the sensing electrodes.

DESCRIPTION OF THE FIFTH PREFERRED EMBODIMENT

Figure 16:
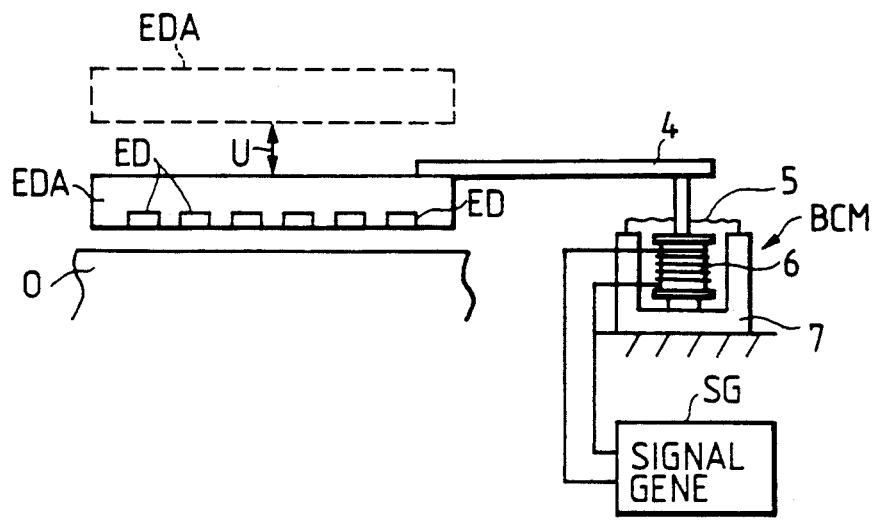
FIG. 16 is a diagram of an apparatus according to a fifth embodiment of this invention.

FIG. 16 shows a fifth embodiment of this invention which is similar to the embodiment of FIGS. 9-15 except for the design changes indicated hereinafter.

In the embodiment of FIG. 16, a sensing head EDA is connected to a movable portion (armature) 6 of a drive device BCM via a connection member 4 and a central shaft 5. A signal generator SG outputs a drive signal to the drive device BCM. The drive device BCM moves the sensing head EDA toward and away from a measured object O in a direction U in response to the drive signal. The drive device BCM includes a permanent magnet 7 cooperating with the movable portion 6.

The sensing head EDA is periodically moved by the drive device BCM between two positions close to and remote from the measured object O respectively as shown in FIG. 17(a). The linear scan of the measured object O and the resetting of the voltages of the gates of detecting transistors are performed alternately in synchronism with the change of the sensing head EDA between the close and remote positions.

In a first example, while the sensing head EDA remains in the close position, the linear scan of the measured object O continues to be performed and thus the detection of the surface potential at the linear portion of the measured object remains performed as shown in FIG. 17(b). In addition, while the sensing head EDA remains in the remote position, the resetting of the voltages of the gates of the detecting transistors continues to be performed as shown in FIG. 17(b).

In a second example, during a part of the period where the sensing head EDA remains in the close position, the linear scan of the measured object O continues to be performed and thus the detection of the surface potential at the linear portion of the measured object remains performed as shown in FIG. 17(c). In addition, during a part of the period where the sensing head EDA remains in the remote position, the resetting of the voltages of the gates of the detecting transistors continues to be performed as shown in FIG. 17(c).

In a third example, while the sensing head EDA remains in the remote position, the linear scan of the measured object O continues to be performed and thus the detection of the surface potential at the linear portion of the measured object remains performed as shown in FIG. 17(d). In addition, while the sensing head EDA remains in the close position, the resetting of the voltages of the gates of the detecting transistors continues to be performed as shown in FIG. 17(d).

In a fourth example, during a part of the period where the sensing head EDA remains in the remote position, the linear scan of the measured object O continues to be performed and thus the detection of the surface potential at the linear portion of the measured object remains performed as shown in FIG. 17(e). In addition, during a part of the period where the sensing head EDA remains in the close position, the resetting of the voltages of the gates of the detecting transistors continues to be performed as shown in FIG. 17(e).

DESCRIPTION OF THE SIXTH PREFERRED EMBODIMENT

Figure 17:
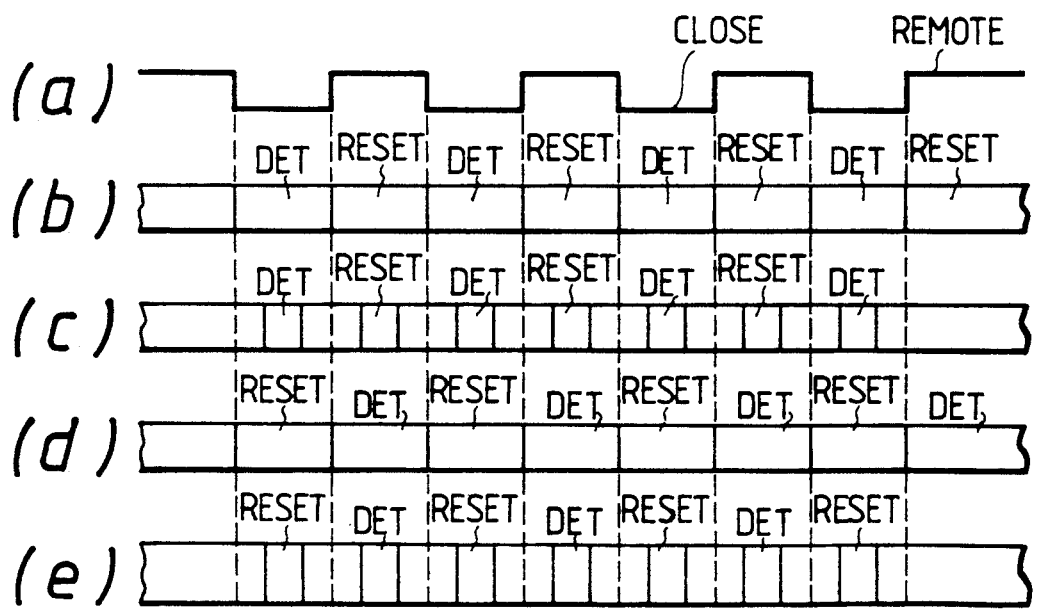
FIG. 17 is a diagram showing the timing relationship among conditions of portions of the apparatus of FIG. 16.
Figure 18:
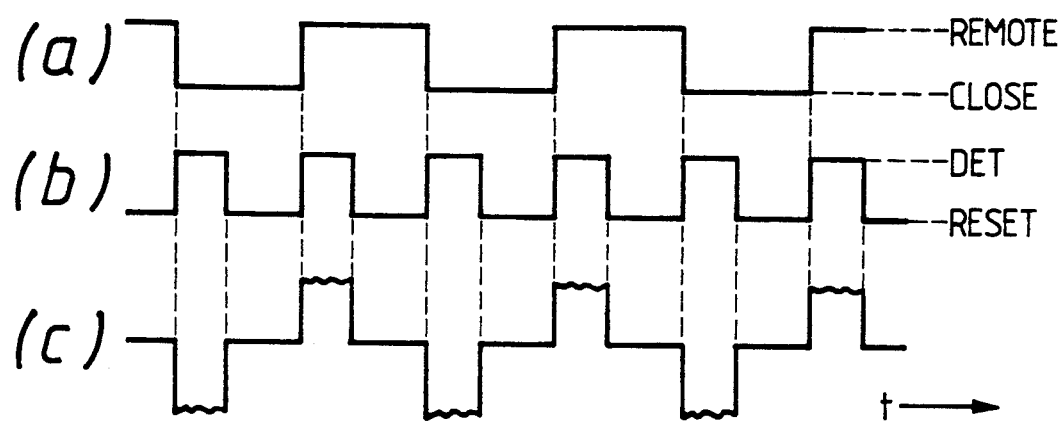
FIG. 18 is a diagram showing the timing relationship among different conditions of portions of an apparatus according to a sixth embodiment of this invention.
Figure 19:
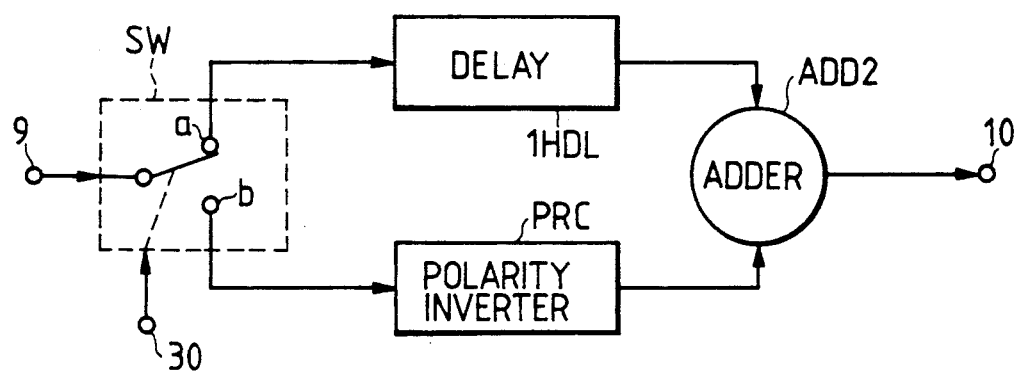
FIG. 19 is a block diagram of part of the apparatus of the sixth embodiment.

FIGS. 18 and 19 relate to a sixth embodiment of this invention which is similar to the embodiment of FIGS. 16 and 17 except for the design changes indicated hereinafter.

As shown in FIG. 18(a), a sensing head is periodically moved between two positions close to and remote from a measured object respectively. As shown in FIG. 18(b), during each period where the sensing head remains in the close position, the linear scan of the measured object and thus the detection of the surface potential at the linear portion of the measured object are performed and then the resetting of the voltages of the gates of detecting transistors is performed. In addition, during each period where the sensing head remains in the remote position, the linear scan of the measured object and thus the detection of the surface potential at the linear portion of the measured object are performed and then the resetting of the voltages of the gates of the detecting transistors is performed.

In this embodiment, the output signal from the sensing head periodically changes in polarity as shown in FIG. 18(c).

As shown in FIG. 19, this embodiment includes a switch SW whose movable contact receives the output signal from the sensing head via a terminal 9. The movable contact of the switch SW is periodically moved between first and second positions at a 1-line scanning period in response to a control signal fed to the switch SW via a terminal 30. When the movable contact of the switch SW assumes the first and second positions, it connects with a fixed contact "a" and a fixed contact "b" of the switch SW respectively. The fixed contact "a" of the switch SW is connected to the input terminal of a delay circuit 1HDL which delays an input signal by a 1-line scanning period. The fixed contact "b" of the switch SW is connected to the input terminal of a polarity inverter PRC. The output terminals of the delay circuit 1HDL and the polarity inverter PRC are connected to the respective input terminals of an adder ADD2. The output terminal of the adder ADD2 is connected to an output terminal 10.

When the movable contact of the switch SW connects with the fixed contact "b" thereof, the current detection output signal from the sensing head is passed through the switch SW to the polarity inverter PRC and is inverted in polarity by the polarity inverter PRC. Therefore, the inverted detection signal has the same polarity as the delayed detection signal from the delay circuit 1HDL. The inverted detection signal and the delayed detection signal are added by the adder ADD2 and are combined into the output signal applied to the output terminal 10. The resultant output signal has a detection voltage twice the detection voltage of the output signal from the sensing head.

When the movable contact of the switch SW connects with the fixed contact "a" thereof, the current detection output signal from the sensing head is passed through the switch SW to the delay circuit 1HDL. After the detection output signal is delayed by the delay circuit 1HDL by a 1-line scanning period, the delayed output signal is fed to the adder ADD2.

As described previously, the leakage current from the drain to the gate of each detecting transistor causes unwanted components in the detection output signal from the sensing head. Such unwanted components in the output signal from the delay circuit 1HDL has a polarity opposite that of unwanted components in the output signal from the polarity inverter PRC. Accordingly, such unwanted components are removed by the adder ADD2 so that the output signal from the adder ADD2 accurately represents the surface potential of the measured object.

DESCRIPTION OF THE SEVENTH PREFERRED EMBODIMENT

Figure 20:
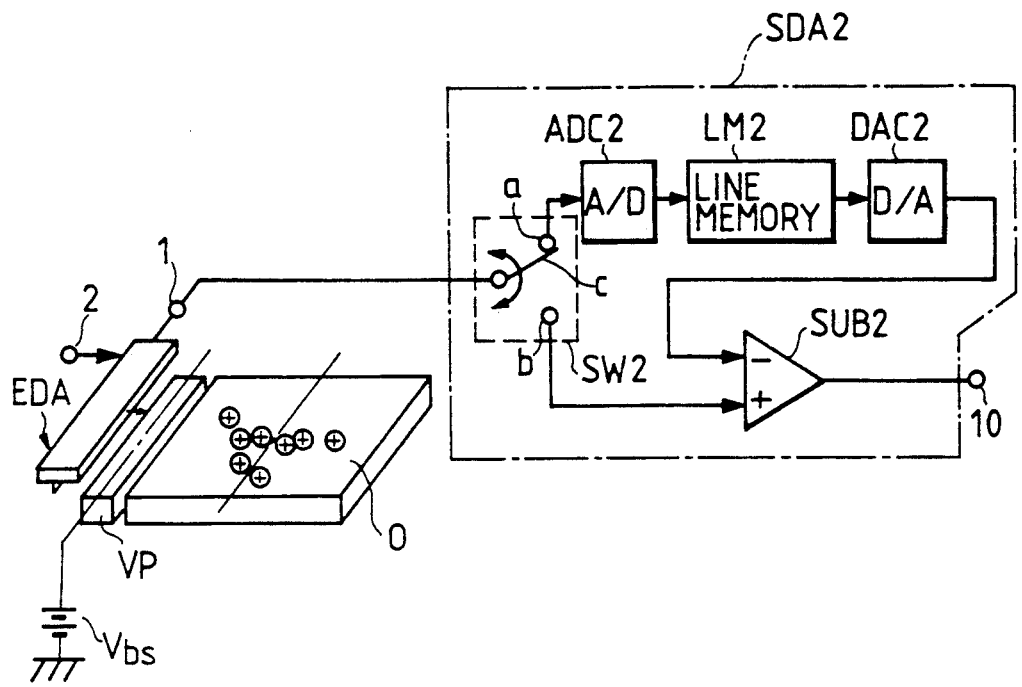
FIG. 20 is a diagram of an apparatus according to a seventh embodiment of this invention.

With reference to FIG. 20, an apparatus according to a seventh embodiment of this invention includes a sensing head EDA outputting a detection signal via an output terminal 1 to a fixed contact of a switch SW2 within a signal processor SDA2.

A measured object O has a surface potential whose distribution corresponds to an optical image. The sensing head EDA is moved over the measured object O by a suitable drive mechanism (not shown) to scan the surface of the measured object O. As will be described hereinafter, the sensing head EDA includes a linear array of sensing electrodes. While the sensing head EDA remains in a position, a linear portion of the measured object O which opposes the linear array of the sensing electrodes is scanned. After such a line scan is completed, the sensing head EDA is moved to a next position and a subsequent line scan is performed. The line scan is periodically and successively performed until the entire surface of the measured object O is scanned.

A reference member VP extends parallel to the sensing head EDA and extends along an edge of the measured object O. Before the scan of the measured object, the reference member VP is scanned by the sensing head EDA. A power source Vbs subjects the reference member VP to a predetermined surface potential Vb approximately equal to a surface potential at a portion of the measured object O which corresponds a black portion of the optical image.

During a first period, the sensing head EDA scans the reference member VP and the movable contact of the switch SW2 is connected to a fixed contact "a" thereof so that the detection output signal from the sensing head EDA is applied to an analog-to-digital converter ADC2. The detection signal is converted by the converter ADC2 into a corresponding digital detection signal which is stored into a line memory LM2. The digital detection signal stored into the line memory LM2 has a quantity corresponding to one line. During this period, since the sensing head EDA scans the reference member VP, the detection signal stored in the line memory LM2 represents a signal level corresponding to the black portion of the optical image.

Figure 21:
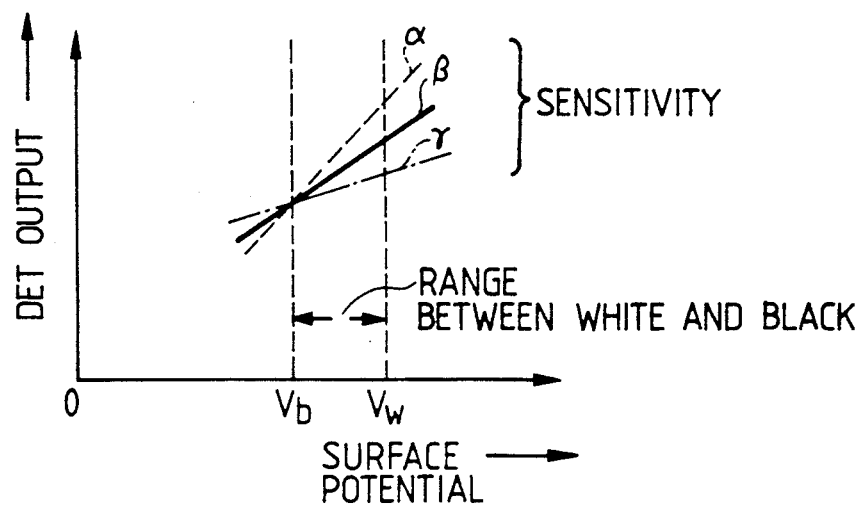
FIG. 21 is a diagram showing the relationship between the surface potential of the measured object and the detection output in the apparatus of FIG. 20.

During a subsequent period, the sensing head ED starts to scan the measured object and the movable contact of the switch SW2 is connected to a fixed contact "b" thereof so that the detection output signal from the sensing head EDA is applied to a first input terminal of a subtracter SUB2. A digital-to-analog converter DAC2 converts the black digital output signal from the line memory LM2 into a corresponding analog black signal applied to a second input terminal of the subtracter SUB2. The subtracter SUB2 subtracts the black signal from the detection signal and thereby derives a difference detection signal applied to an output terminal 10. The subtraction of the black signal from the detection signal partially compensates for a variation among the sensitivities of sensing elements including the respective sensing electrodes of the sensing head EDA. This advantage is suggested in FIG. 21 where the lines $\alpha$, $\beta$, and $\gamma$ represent different sensitivities of sensing elements which are made by the previously-mentioned compensation into the same point at the surface potential Vb corresponding to the black portion of the optical image. If such compensation is not performed, the sensitivity characteristic lines α, β, and γ assume different points at the black potential Vb. In FIG. 21, the character Vw represents a surface potential which corresponds to a white portion of the optical image.

Figure 22:
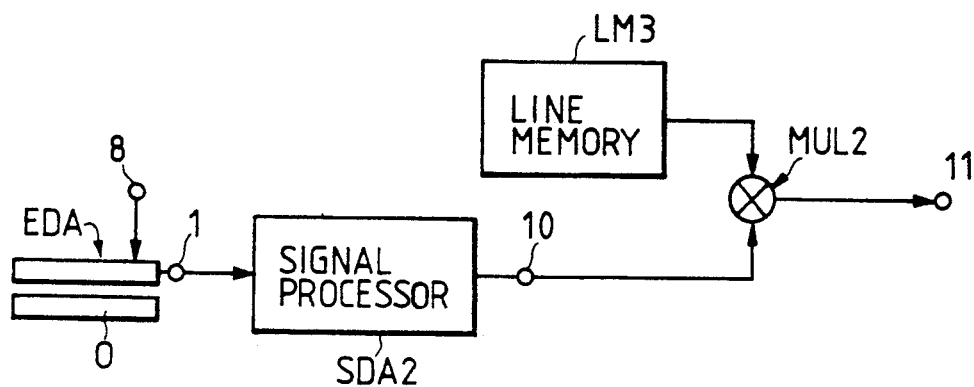
FIG. 22 is a diagram of the apparatus of the seventh embodiment.
Figure 23:
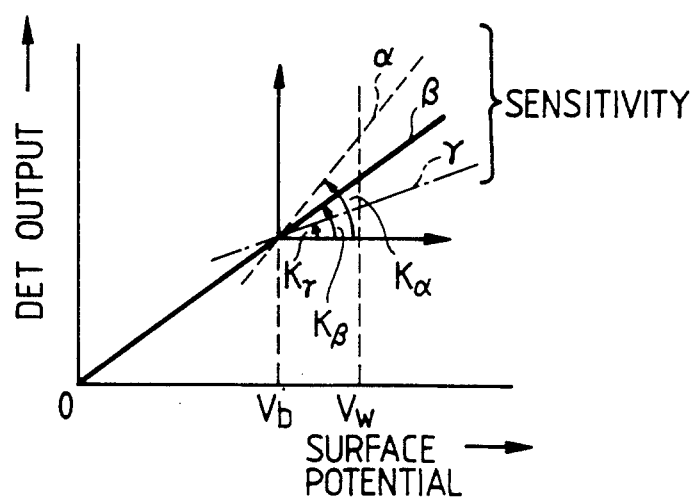
FIG. 23 is a diagram showing the relationship between the surface potential of the measured object and the detection output in the apparatus of FIG. 22.

As shown in FIG. 22, the output signal from the signal processor SDA2 is fed to a first input terminal of a multiplier MUL2 via the output terminal 10. A line memory LM3 stores a set of compensation signals corresponding to respective compensation coefficients of the sensing elements. The compensation signals are sequentially outputted from the line memory LM3 to a second input terminal of the multiplier MUL2 at timings matching to the application of the output signal from the signal processor SDA2 to the multiplier MUL2. The multiplier MUL2 multiplies the output signal from the signal processor SDA2 by the compensation signals to completely compensate for a variation among the sensitivities of sensing elements including the respective sensing electrodes of the sensing head EDA. This advantage is suggested in FIG. 23 where the lines α, β, and γ represent different sensitivities of sensing elements which are made by the previously-mentioned complete compensation into the same sensitivity characteristic line. In FIG. 21, the character Vw represents a surface potential which corresponds to a white portion of the optical image, and the characters K α, K β, and K γ denote the compensation coefficients for the sensing elements related to the lines α, β, and γ respectively. The output signal from the multiplier MUL2 is fed to an output terminal 11.

The compensation coefficients are determined on the basis of the output signals from the sensing elements which occur when a reference measured object having a known surface potential is scanned.

Figure 24:
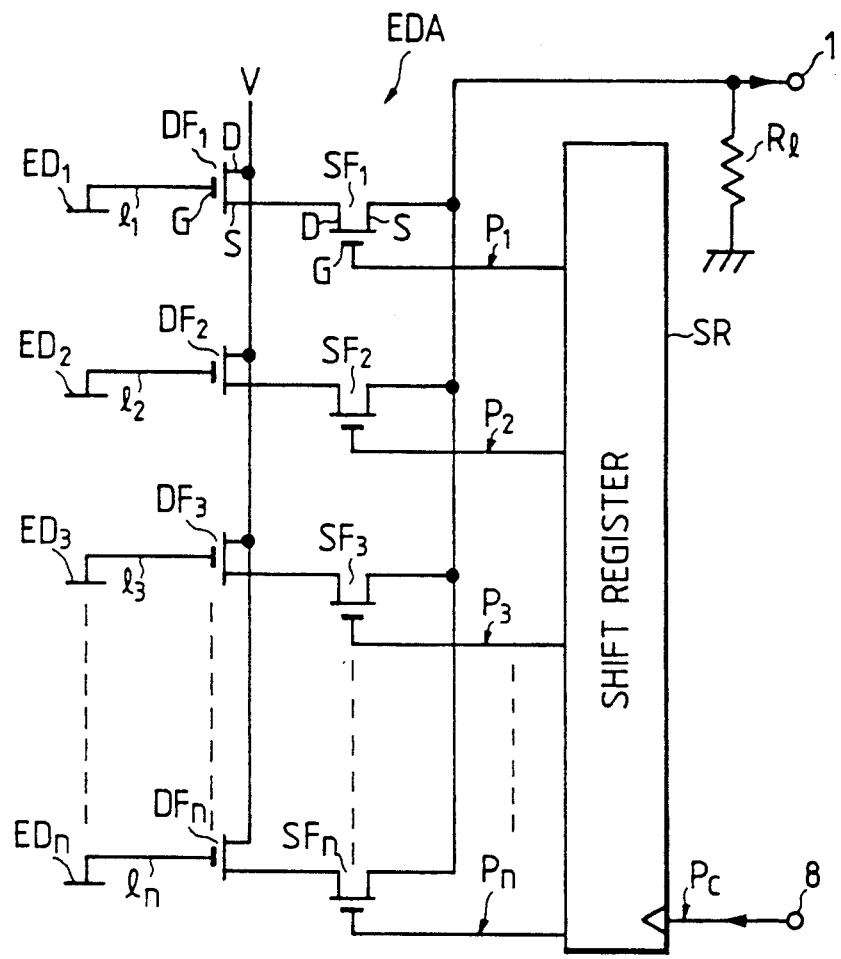
FIG. 24 is a diagram of the sensing head in the apparatus of the seventh embodiment.

As shown in FIG. 24, the sensing head EDA includes sensing electrodes ED1-EDn which are connected to the gates of detecting transistors DF1-DFn via connection lines l1-ln respectively.

The drains of the detecting transistors DF1-DFn are connected in common to a power supply line V. The sources of the detecting transistors DF1-DFn are connected to the drains of switching transistors SF1-SFn respectively. The sources of the switching transistors SF1-SFn are connected in common to the output terminal 1. A load resistor Rl is connected between the output terminal 1 and the ground.

The switching transistors SF1-SFn serve as switches connecting and disconnecting the detecting transistors DF1-DFn to and from the output terminal 1. In each of the switching transistors SF1-SFn, the source-drain path is made conductive and nonconductive when the gate receives a high level voltage and a low level voltage respectively. In other words, each of the switching transistors SF1-SFn is made on and off when its gate receives a high level voltage and a low level voltage respectively.

The gates of the switching transistors SF1-SFn are connected to respective output terminals of a shift register SR and are thus subjected to output signals P1-Pn from the shift register SR. A clock terminal of the shift register SR receives a clock signal Pc via a clock input terminal 8, the clock signal Pc taking a waveform similar to that shown in FIG. 11.

Similarly to the embodiment of FIGS. 10 and 11, the output signals P1-Pn from the shift register SR sequentially assume high levels in response to the input clock signal Pc. Accordingly, the switching transistors SF1-SFn are sequentially made on in accordance with the clock signal Pc.

The sensing electrodes ED1-EDn are arranged linearly in a manner similar to that shown in FIG. 12.

The apparatus operates as follows. The sensing head EDA is made close to the measured object O. In addition, the sensing electrodes ED1-EDn are opposed to the surface of the measured object O. Electrostatic induction allows the sensing electrodes ED1-EDn to be subjected to voltages corresponding to surface potentials of portions of the measured object O which oppose the sensing electrodes ED1-EDn respectively. The induced voltages are transmitted from the sensing electrodes ED1-EDn to the gates of the detecting transistors DF1-DFn via the connection lines l1-ln respectively.

As described previously, the switching transistors SF1-SFn are sequentially made on. Accordingly, voltage signals corresponding to the voltages of the gates of the detecting transistors DF1-DFn are sequentially transmitted from the sources of the detecting transistors DF1-DFn to the output terminal 1 via the source-drain paths of the switching transistors SF1-SFn. Thus, an output signal generated at the output terminal 1 has a time-dependent variation which corresponds to the distribution of the surface potential of the linear portion of the measured object.

DESCRIPTION OF THE EIGHTH PREFERRED EMBODIMENT

Figure 25:
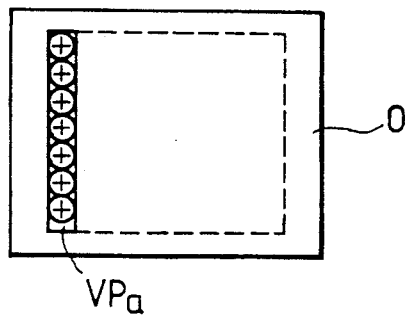
FIG. 25 is a plan view of a measured object in an apparatus according to an eighth embodiment of this invention.

FIG. 25 shows an eighth embodiment of this invention which is similar to the embodiment of FIGS. 20-24 except that the measured object 0 includes a reference area VPa which has the same function as the reference member VP of the embodiment of FIGS. 20-24.

DESCRIPTION OF THE NINTH PREFERRED EMBODIMENT

Figure 26:
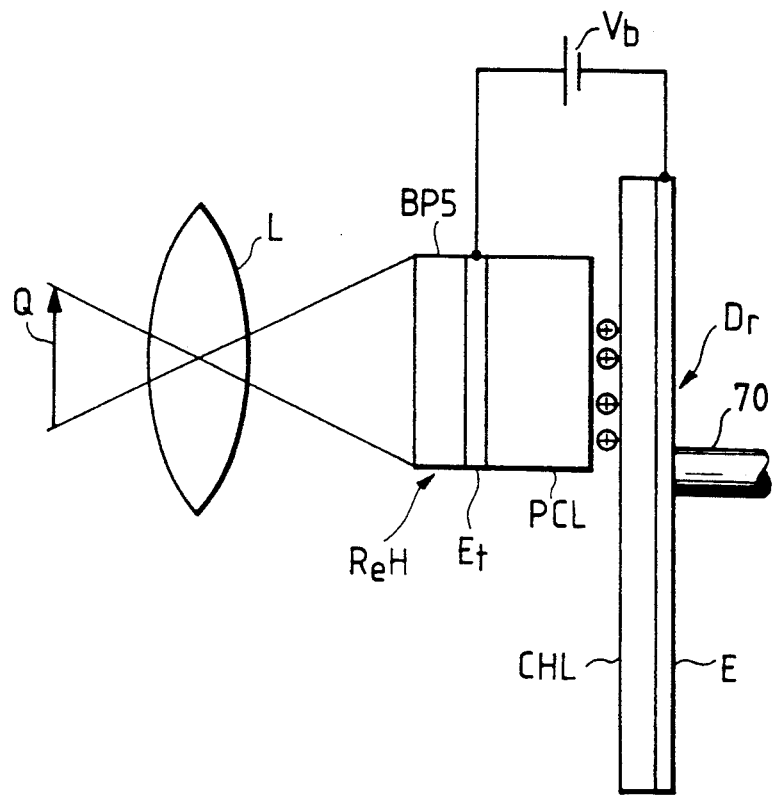
FIG. 26 is a diagram of an apparatus of a ninth embodiment of this invention.

With reference to FIG. 26 showing a ninth embodiment of this invention, a scene of an object Q is focused by a lens L on a recording head ReH which generates a charge latent image on a disk-shaped recording medium Dr in correspondence with the scene of the object Q.

The recording medium Dr includes an electrode E and a charge latent image forming member CHL. The electrode E functions as a base plate of the recording medium Dr. The member CHL is made of excellent insulating material. The recording medium Dr is rotatable about a shaft 70.

The recording head ReH has a laminated structure including a glass substrate or base plate BP5, a transparent electrode Et, and a photoconductive layer PCL. An electric power source Vb is connected between the electrode Et and the electrode E of the recording medium Dr to generate a predetermined electric field between the electrodes Et and E.

When an image of the object Q is formed by the lens L on the photoconductive layer PCL of the recording head ReH, the electric resistance of the photoconductive layer PCL varies in accordance with the image of the object Q so that a charge latent image is formed on the member CHL of the recording medium Dr in correspondence with the image of the object Q. It should be noted that the recording medium Dr may have other shapes such as a tape shape, a sheet shape, or a card shape.

The charge latent image on the recording medium Dr is detected by a sensing head EDA (not shown in FIG.

Figure 27:
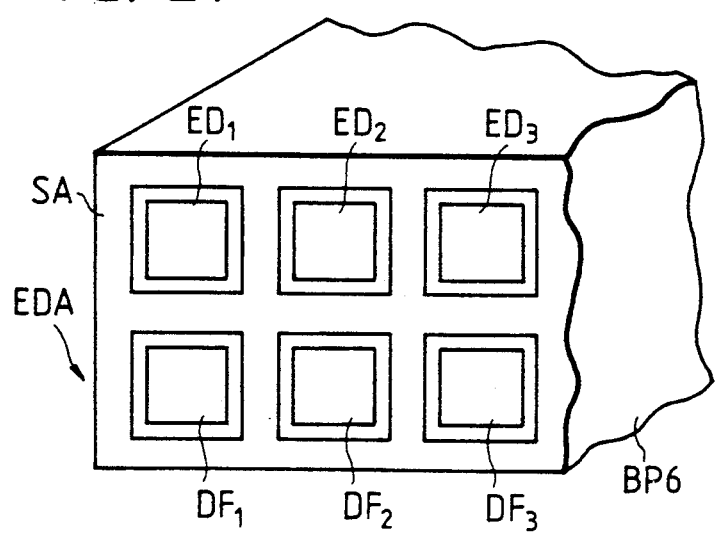
FIG. 27 is a perspective view of a sensing head in the apparatus of the ninth embodiment.

26) which has a circuit structure similar to that shown in FIG. 24. As shown in FIG. 27, the sensing head EDA has sensing electrodes ED1-EDn and detecting transistors DF1-DFn formed on a substrate BP6. The sensing electrodes ED1-EDn are equally spaced and are arranged in a line. The detecting transistors DF1-DFn are equally spaced and are arranged in a line parallel to the line of the sensing electrodes ED1-EDn. The detecting transistors DF1-DFn are composed of floating-gate MOS field effect transistors. A shield member SA extends between the sensing electrodes ED1-EDn and the detecting transistors DF1-DFn. The sensing electrodes ED1-EDn, the detecting transistors DF1-DFn, and the shield member SA are coated with an insulating protective layer (not shown) of silicon dioxide so that they are airtightly separated from the atmosphere.

Figure 28:
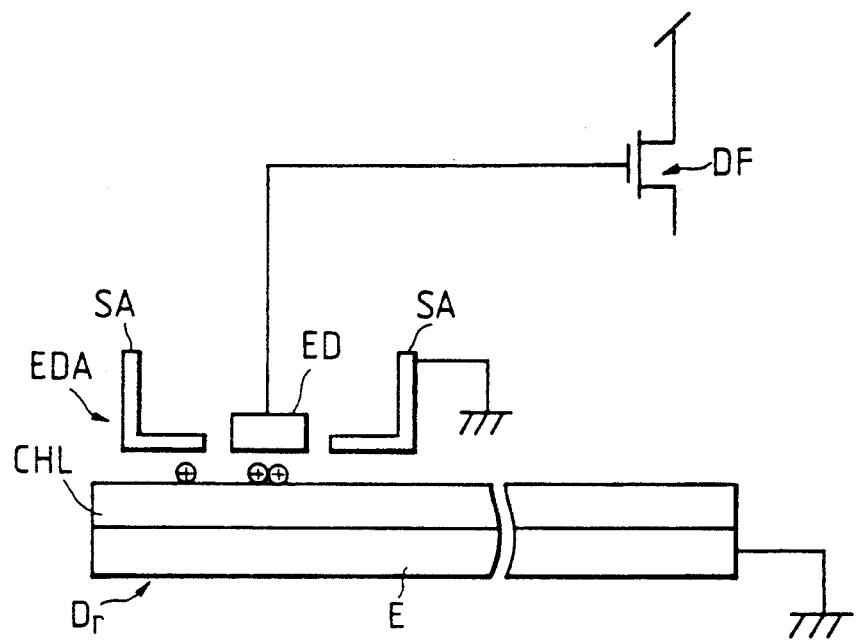
FIG. 28 is a diagram of part of the apparatus of the ninth embodiment.

As shown in FIG. 28, the sensing head EDA is closely opposed to the recording medium Dr. Electrostatic induction allows the sensing electrodes ED to be subjected to potentials corresponding the latent image on the member CHL of the recording medium Dr. The induced potentials are sequentially transmitted through the detecting transistors DF to obtain a time series detection output signal. The shield member SA is grounded. The shield member SA provides electrostatic shields between the sensing electrodes ED, ensuring a high resolution of the sensing head EDA.

This embodiment is advantageous in that the use of the floating-gate MOS transistors for the detecting transistors DF allows the omission of the resetting means acting on the gates of the detecting transistors DF.

Figure 29:
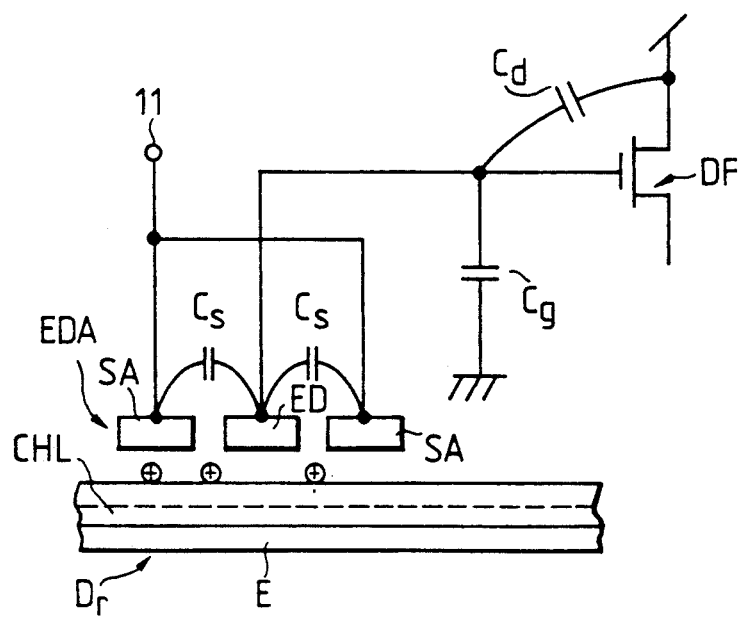
FIG. 29 is a schematic diagram of part of the apparatus of the ninth embodiment.

As shown in FIG. 29, the shield member SA is connected to a terminal 110 subjected to an adjustable voltage. The sensing electrodes ED are connected to the shield member SA by stray capacitances Cs. Stray capacitances Cd exist between the gates and the drains of the detecting transistors DF. Stray capacitances Cg are connected to the gates of the detecting transistors DF. The gates of the detecting transistors DF are electrically connected to the terminal 11 via the sensing electrodes ED, the stray capacitances Cs, and the shield member SA, so that the voltages of the gates of the detecting transistors DF depend on the voltage of the terminal 110. The voltage of the terminal 110 is chosen so that the floating gates of the floating-gate transistors DF will be exposed to suitable bias voltages ensuring reliable operations of the transistors DF.

Figure 30:
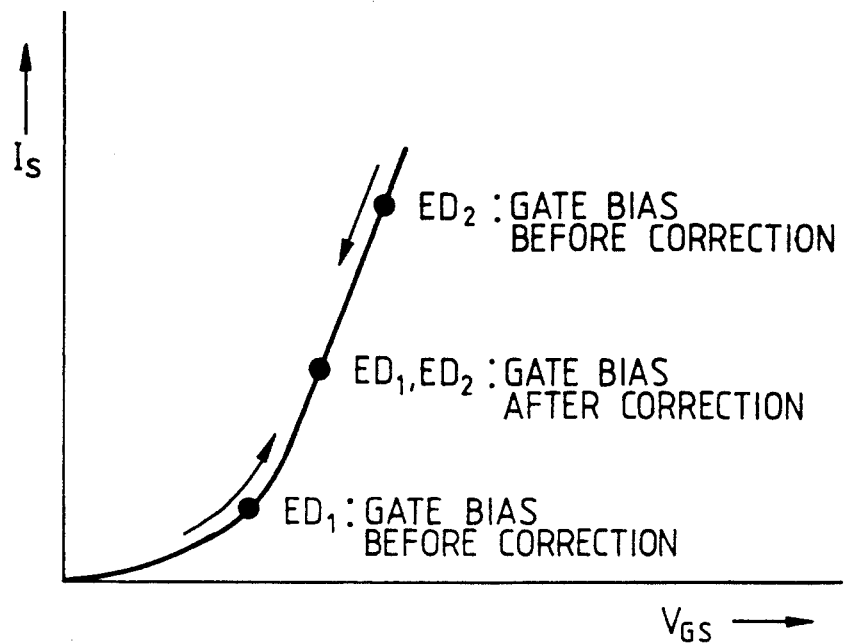
FIG. 30 is a diagram showing the biases applied to the gates of the detecting transistors in the apparatus of the ninth embodiment.

In cases where a plurality of shield members SA are provided for the respective sensing electrodes ED, voltages applied to the shield members SA are independently adjustable. In these cases, as shown in FIG. 30, different gate biases of the detecting transistors DF1 and DF2 are corrected to a suitable gate bias by independently adjusting the voltages applied to the shield members SA corresponding to the sensing electrodes ED1 and ED2 respectively.

DESCRIPTION OF THE TENTH PREFERRED EMBODIMENT

Figure 31:
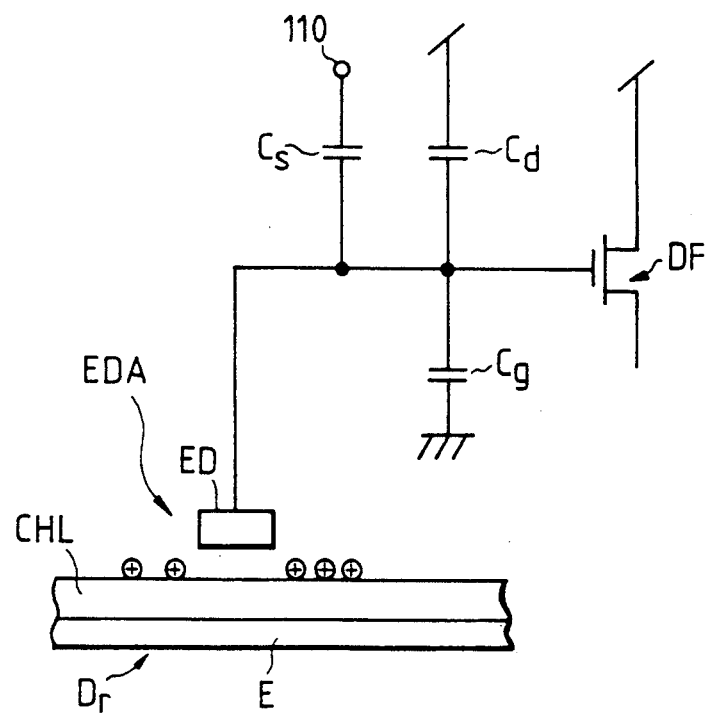
FIG. 31 is a schematic diagram of an apparatus according to a tenth embodiment of this invention.

FIG. 31 shows a tenth embodiment of this invention which is similar to the embodiment of FIGS. 26-30 except that the terminal 110 and the sensing electrodes ED are arranged so that they are connected via stray capacitances Cs.

DESCRIPTION OF THE ELEVENTH PREFERRED EMBODIMENT

Figure 32:
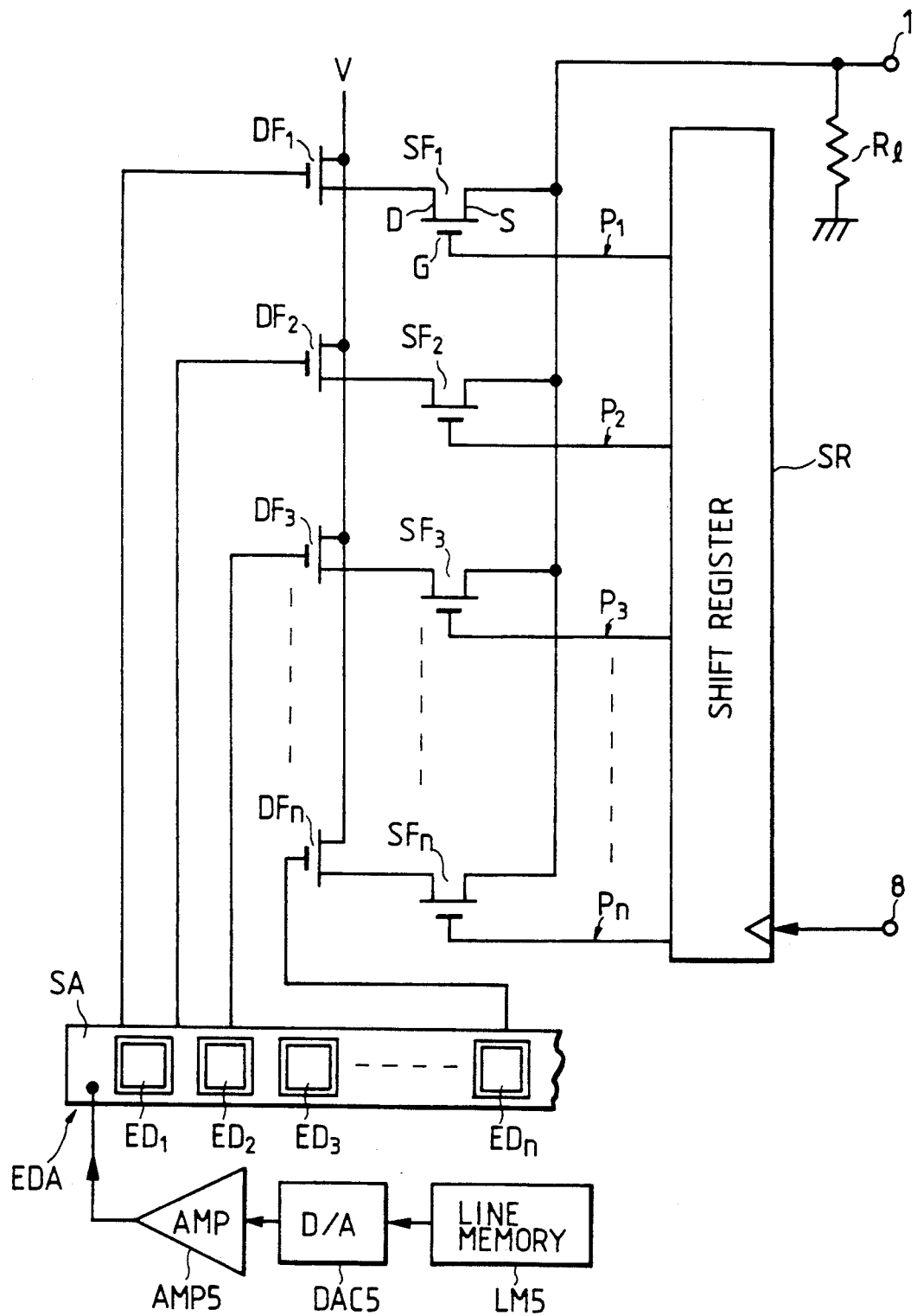
FIG. 32 is a diagram of an apparatus according to an eleventh embodiment of this invention.

FIG. 32 shows an eleventh embodiment of this invention which is similar to the embodiment of FIGS. 26-30 except for the design changes indicated hereinafter.

In the embodiment of FIG. 32, a line memory LM5 stores data related to suitable gate biases of detecting floating-gate MOS field effect transistors DF1-DFn which ensure reliable operations of the transistors DF1-DFn. Detection signals are sequentially transmitted from the detecting transistors DF1-DFn via switching transistors SF1-SFn to an output terminal 1. The gate bias data are outputted from the line memory LM5 to a digital-to-analog converter DAC5 in synchronism with the sequential transmission of the detection signals from the detecting transistors DF1-DFn. The gate bias data are converted by the converter DAC5 into a corresponding voltage which is applied to a shield member SA via an amplifier AMP5. As a result, the voltage applied to the shield member SA is determined by the gate bias data of one detecting transistor from which the detection signal is currently transmitted. Therefore, the gates of the detecting transistors DF1-DFn are exposed to the respective suitable gate biases when the detection signals are transmitted from the detecting transistors DF1-DFn.

DESCRIPTION OF THE TWELFTH PREFERRED EMBODIMENT

Figure 33:
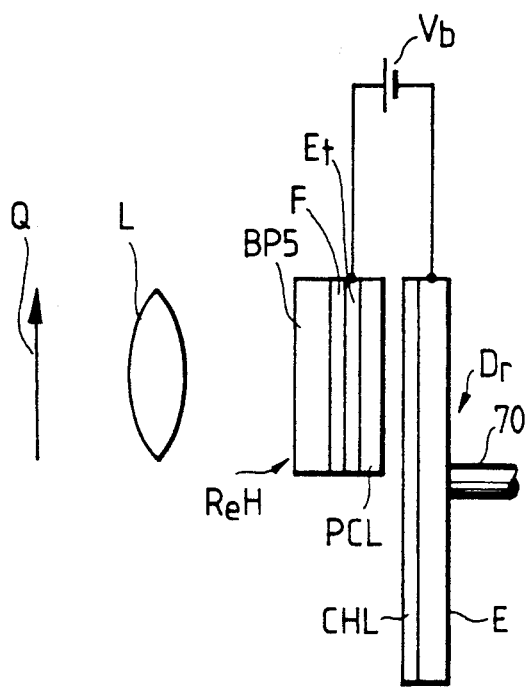
FIG. 33 is a diagram of an apparatus according to a twelfth embodiment of this invention.

With reference to FIG. 33 showing a twelfth embodiment of this invention, a scene of an object Q is focused by a lens L on a recording head ReH which forms a charge latent image on a disk-shaped recording medium Dr in correspondence with the scene of the object Q.

Figure 34:
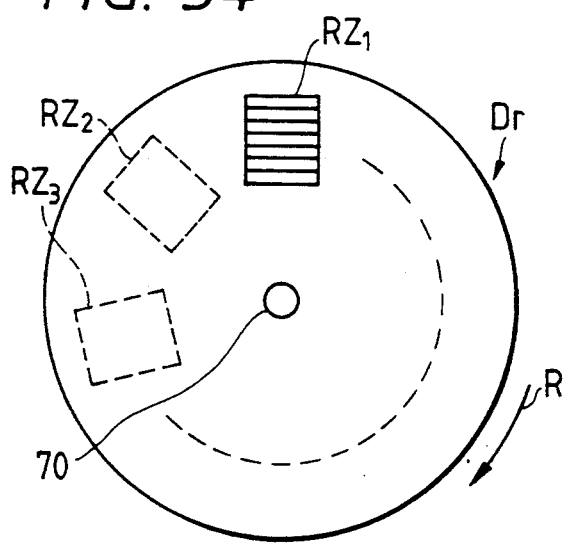
FIG. 34 is a plan view of the recording medium of FIG. 33.

The recording medium Dr includes an electrode E and a charge latent image forming member CHL. The electrode E functions as a base plate of the recording medium Dr. The member CHL is made of excellent insulating material. The recording medium Dr is rotatable about a shaft 70. As shown in FIG. 34, when the recording medium Dr rotates in a direction R, the charge image of the object Q is sequentially recorded on regions RZ1, RZ2, . . . of the recording medium Dr.

The recording head ReH has a laminated structure including a glass substrate or base plate BP5, a color stripe filter F, a transparent electrode Et, and a photoconductive layer PCL. An electric power source Vb is connected between the electrode Et and the electrode E of the recording medium Dr to generate a predetermined electric field between the electrodes Et and E.

When an image of the object Q is formed by the lens L on the photoconductive layer PCL of the recording head ReH via the color filter F, the electric resistance of the photoconductive layer PCL varies in accordance with the image of the object Q so that a charge latent image is formed on the member CHL of the recording medium Dr in correspondence with the image of the object Q. It should be noted that the recording medium Dr may have other shapes such as a tape shape, a sheet shape, or a card shape.

Figure 35:
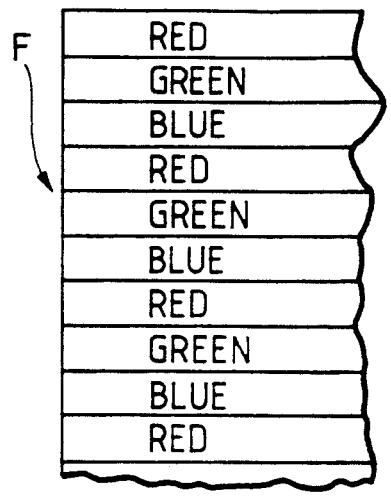
FIG. 35 is a plan view of the color filter of FIG. 33.
Figure 36:
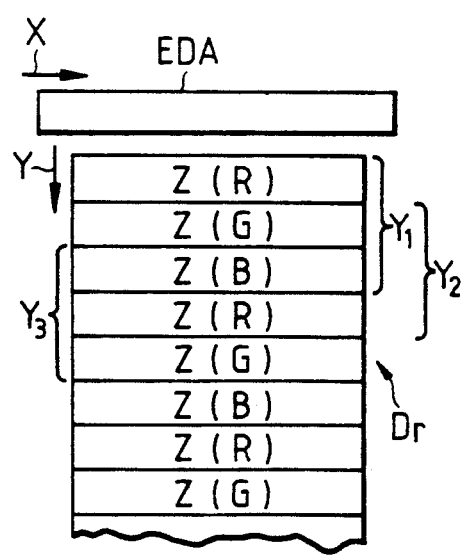
FIG. 36 is a diagram of a sensing head and the recording medium in the apparatus of the twelfth embodiment.

As shown in FIG. 35, the color filter F has recurrent groups each composed of parallel stripes of red, green, and blue. In correspondence with the color stripe arrangement of the filter F, the charge latent image formed on the recording medium Dr is divided into recurrent groups each composed of stripes Z(R), Z(G), and Z(B) corresponding to red, green, and blue respectively as shown in FIG. 36.

The charge latent image on the recording medium Dr is detected by a sensing head EDA which has a structure similar to that shown in FIG. 32. As shown in FIG. 36, the sensing head EDA scans linearly the recording medium Dr in a direction X parallel to the stripes Z(R), Z(G), and Z(B). During this linear scan, one of a red signal, a green signal, and a blue signal corresponding to the respective stripes Z(R), Z(G), and Z(B) is outputted. After this linear scan is completed, the sensing head EDA is moved in a direction Y perpendicular to the direction X and a subsequent linear scan is started for subsequent one of the stripes Z(R), Z(G), and Z(B). Such scanning processes are reiterated until an effective surface of the recording medium Dr is completely scanned. During the scan of the recording medium Dr, a red signal, a green signal, and a blue signal are sequentially and periodically outputted from the sensing head EDA.

Figure 37:
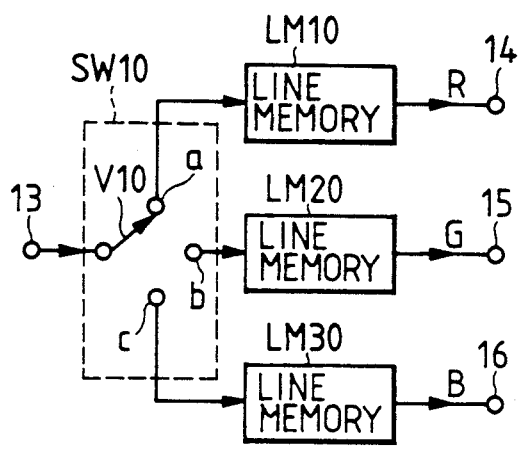
FIG. 37 is a diagram of a signal processor in the apparatus of the twelfth embodiment.

As shown in FIG. 37, a signal processor includes a switch SW10 having a movable contact V10 to which the output signal from the sensing head EDA is applied via a terminal 13. Fixed contacts "a", "b", and "c" of the switch SW10 are connected to line memories LM10, LM20, and LM30 respectively. The movable contact V10 is sequentially connected with the fixed contacts "a", "b", and "c" at a line scanning period so that red signals, green signals, and blue signals are distributed to and stored into the line memories LM10, LM20, and LM30 respectively. The red signal, the green signal, and the blue signal are transferred from the line memories LM10, LM20, and LM30 via output terminals 14, 15, and 16 respectively. The red signal, the green signal, and the blue signal transferred via the output terminals 14, 15, and 16 are combined into luminance signals Y1, Y2, Y3, ... which correspond to sets of the stripes Z(R), Z(G), and Z(B) as shown in FIG. 36.

DESCRIPTION OF THE THIRTEENTH PREFERRED EMBODIMENT

Figure 38:
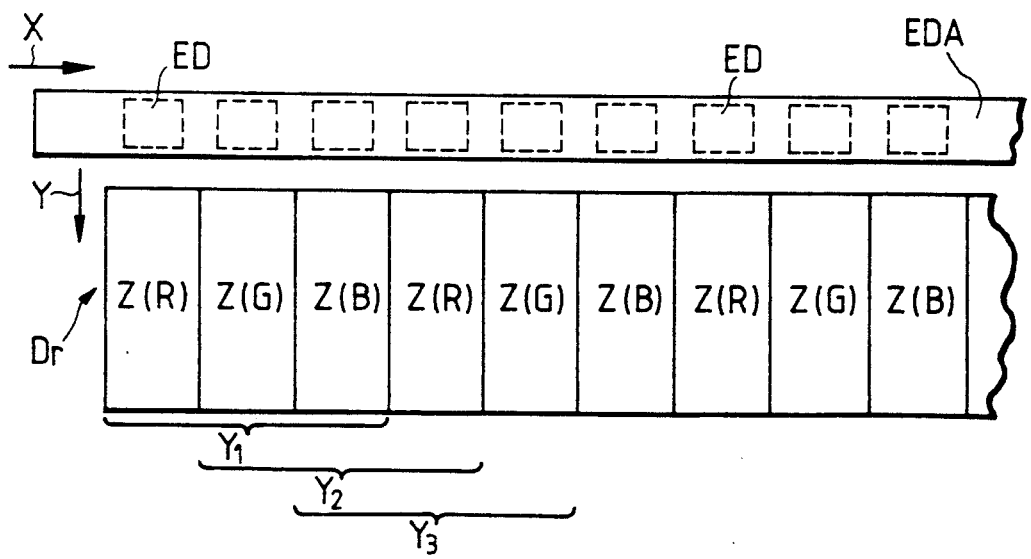
FIG. 38 is a diagram of an apparatus according to a thirteenth embodiment of this invention.

FIG. 38 shows a thirteenth embodiment of this invention which is similar to the embodiment of FIGS. 33-37 except for the design changes indicated hereinafter.

In the embodiment of FIG. 38, sensing electrodes ED of a sensing head EDA are arranged to correspond to respective stripes Z(R), Z(G), and Z(B). The sensing head EDA scans linearly the recording medium Dr in a direction X perpendicular to the stripes Z(R), Z(G), and Z(B). During this linear scan, red signals, green signals, and blue signals are sequentially and periodically outputted from the sensing head EDA in correspondence with the respective stripes Z(R), Z(G), and Z(B). After the linear scan is completed, the sensing head EDA is moved in a direction Y perpendicular to the direction X and a subsequent linear scan is started. Such scanning processes are reiterated until an effective surface of the recording medium Dr is completely scanned.

Figure 39:
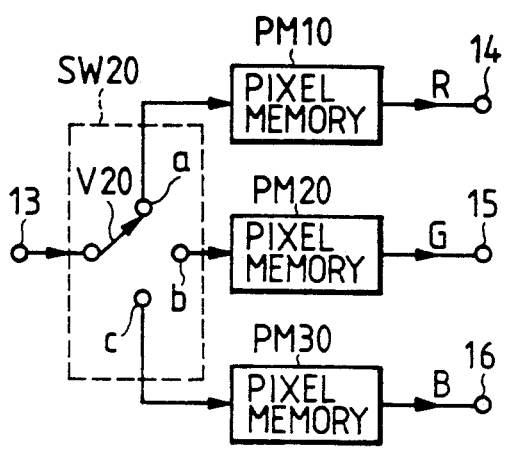
FIG. 39 is a diagram of a signal processor in the apparatus of the thirteenth embodiment.

As shown in FIG. 39, a signal processor includes a switch SW20 having a movable contact V20 to which the output signal from the sensing head EDA is applied via a terminal 13. Fixed contacts "a", "b", and "c" of the switch SW10 are connected to pixel memories PM10, PM20, and PM30 respectively. The movable contact V20 is sequentially connected with the fixed contacts "a", "b", and "c" at a pixel scanning period so that red signals, green signals, and blue signals are distributed to and stored into the pixel memories PM10, PM20, and PM30 respectively. The red signal, the green signal, and the blue signal are transferred from the pixel memories PM10, PM20, and PM30 via output terminals 14, 15, and 16 respectively. The red signal, the green signal, and the blue signal transferred via the output terminals 14, 15, and 16 are combined into luminance signals Y1, Y2, Y3, ... which correspond to sets of the stripes Z(R), Z(G), and Z(B) as shown in FIG. 38.

DESCRIPTION OF THE FOURTEENTH PREFERRED EMBODIMENT

Figure 40:
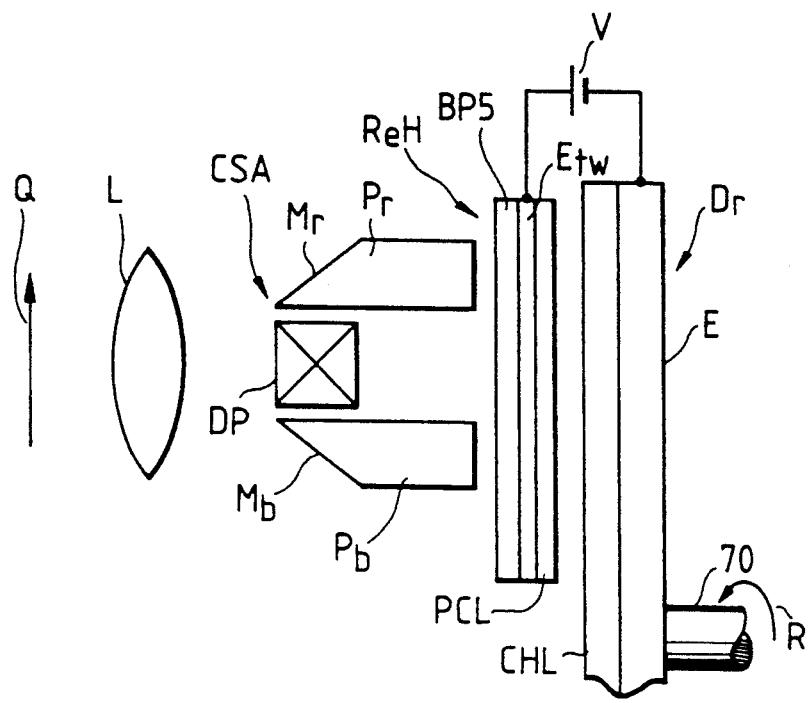
FIG. 40 is a diagram of an apparatus according to a fourteenth embodiment of this invention.

FIG. 40 shows a fourteenth embodiment of this invention which is similar to the embodiment of FIGS. 33-37 except for the design changes indicated hereinafter.

The embodiment of FIG. 40 uses an optical color separator CSA in place of the color filter F (see FIG. 33). The optical color separator CSA is disposed between the lens L and the recording head ReH.

Figure 41:
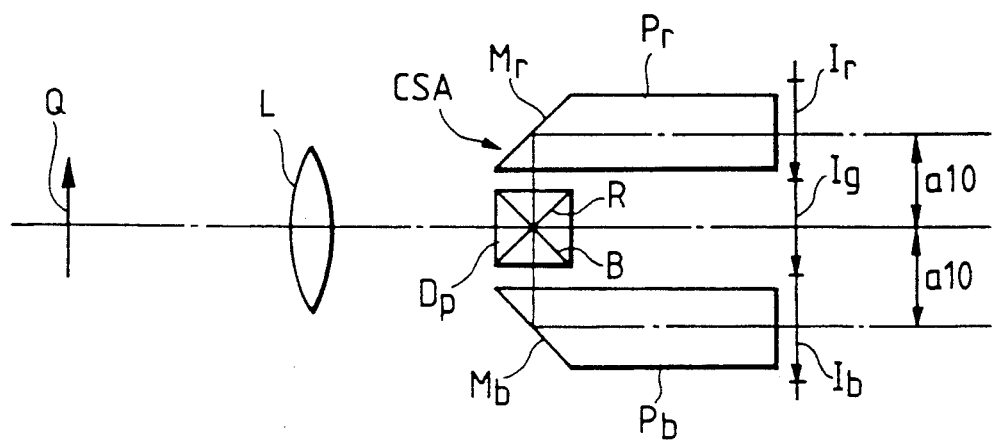
FIG. 41 is a diagram of part of the apparatus of the fourteenth embodiment.
Figure 42:
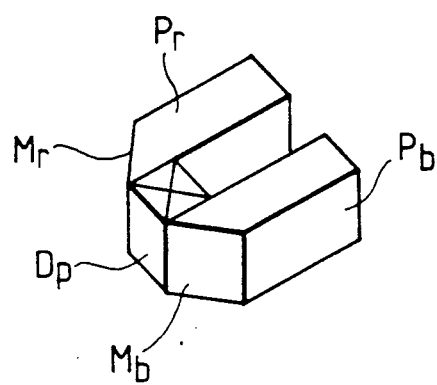
FIG. 42 is a perspective view of the optical color separator of FIG. 40.

As shown in FIGS. 40-42, the optical color separator CSA includes a dichroic mirror or a dichroic prism Dp extending between prisms Pr and Pb having respective total reflection surfaces Mr and Mb. The dichroic prism Dp includes a mirror or an R surface reflecting red light but conducting green and blue light, and a mirror or a B surface reflecting blue light but conducting green and red light. The R surface and the B surface are perpendicular to each other.

Figure 43:
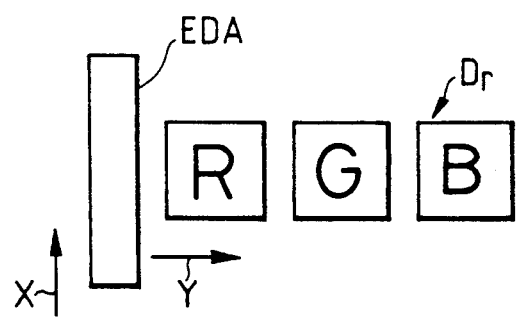
FIG. 43 is a diagram of a sensing head and the recording medium in the apparatus of the fourteenth embodiment.

When light from the object Q is incident to the dichroic prism Dp of the optical color separator CSA, green components of the incident light pass through the dichroic prism Dp and form a green image of the object Q on a region Ig of an image forming surface. Red components of the light are reflected by the R surface of the dichroic prism Dp and are then reflected by the total reflection surface Mr of the prism Pr, forming a red image of the object Q on a region Ir of the image forming surface which adjoins the green region Ig. Blue components of the light are reflected by the B surface of the dichroic prism Dp and are then reflected by the total reflection surface Mb of the prism Pb, forming a blue image of the object Q on a region Ib of the image forming surface which adjoins the green region Ig. Accordingly, as shown in FIG. 43, three charge latent images related to red, green, and blue are formed on separated regions R, G, and B of the recording medium Dr respectively.

As understood from FIG. 41, the total distances travelled by red light and the blue light are greater than the total distance travelled by the green light by an additive distance XX. In addition, the optical axes of the red imaging system and the blue imaging system are separated from the optical axis of the green imaging system by an offset value a10. The offset value a10 and the additive distance XX are equalized by suitably choosing the length of the prisms Pr and Pb and the refractive index of the material for the prisms Pr and Pb.

The sensing head EDA scans linearly the recording medium Dr in a direction X perpendicular to a direction Y along which the regions R, G, and B are arranged. During this linear scan, a signal corresponding to one of red, green, and blue is outputted from the sensing head EDA. After the linear scan is completed, the sensing head EDA is moved in the direction Y and a subsequent linear scan is started. Such scanning processes are reiterated until an effective surface of the recording medium Dr is completely scanned. In the case of FIG. 43, the regions R, G, and B are sequentially scanned so that red signals, green signals, and blue signals are sequentially outputted from the sensing head EDA.

DESCRIPTION OF THE FIFTEENTH PREFERRED EMBODIMENT

Figure 44:
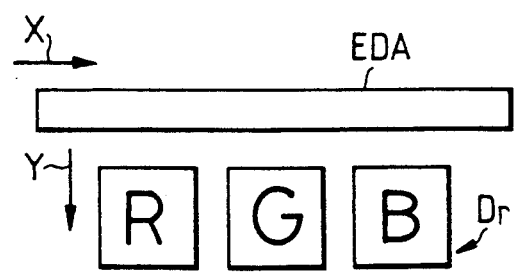
FIG. 44 is a diagram of a sensing head and a recording medium in an apparatus according to a fifteenth embodiment of this invention.

FIG. 44 shows a fifteenth embodiment of this invention which is similar to the embodiment of FIGS. 40-43 except for the design changes indicated hereinafter.

In the embodiment of FIG. 44, the sensing head EDA scans linearly the recording medium Dr in a direction X along which the regions R, G, and B are arranged. During this linear scan, a red signal, a green signal, and a blue signal are sequentially and periodically outputted from the sensing head EDA. After the linear scan is completed, the sensing head EDA is moved in a direction Y perpendicular to the direction X and a subsequent linear scan is started. Such scanning processes are reiterated until an effective surface of the recording medium Dr is completely scanned.

What is claimed is:

1. An apparatus for detecting a distribution of a surface potential, comprising:
   a plurality of sensing electrodes arranged in a line and subjected to voltages electrostatically induced in correspondence with a surface potential of a measured object which represents an optical image;
   means for enabling the sensing electrodes to scan the measured object;
   means for sequentially transferring output signals from the sensing electrodes to a common output line to obtain a time series output signal corresponding to one line;
   a reference member subjected to a surface potential corresponding to a black portion of the optical image, the reference member being scanned by the sensing electrodes;
   means for storing the output signal as a reference signal when the reference member is scanned by the sensing electrodes; and
   means for reading the reference signal and subtracting the reference signal from the output signal when the measured object is scanned by the sensing electrodes.

2. The apparatus of claim 1 further comprising means for storing a data signal representing respective operation characteristics of the sensing electrodes, and means for multiplying the data signal and an output signal from the subtracting means to compensate a variation among the operation characteristics of the sensing electrodes.

3. An apparatus comprising:
   a recording medium holding a charge latent image corresponding to an optical image, the recording medium having a surface potential corresponding to the charge latent image;
   a plurality of sensing electrodes arranged in a line and subjected to voltages electrostatically induced in correspondence with the surface potential of the recording medium;
   means for enabling the sensing electrodes to scan the recording medium;
   means for sequentially transferring output signals from the sensing electrodes to a common output line to obtain a time series output signal corresponding to one line;
   a reference member subjected to a surface potential corresponding to a black portion of the optical image, the reference member being scanned by the sensing electrodes;
   means for storing the output signal as a reference signal when the reference member is scanned by the sensing electrodes; and
   means for reading the reference signal and subtracting the reference signal from the output signal when the recording medium is scanned by the sensing electrodes.

4. The apparatus of claim 3, further comprising means for storing a data signal representing respective operation characteristics of the sensing electrodes, and means for multiplying the data signal and an output signal from the subtracting means to compensate a variation among the operation characteristics of the sensing electrodes.

5. An apparatus comprising:
   a recording medium;
   means for forming a charge latent image on the recording medium in response to an optical image, wherein the recording medium has a surface potential corresponding to the charge latent image;
   a plurality of sensing electrodes arranged in a line and subjected to voltages electrostatically induced in correspondence with the surface potential of the recording medium;
   means for enabling the sensing electrodes to scan the recording medium;
   means for sequentially transferring output signals from the sensing electrodes to a common output line to obtain a time series output signal corresponding to one line;
   a reference member subjected to a surface potential corresponding to a black portion of the optical image, the reference member being scanned by the sensing electrodes;
   means for storing the output signal as a reference signal when the reference member is scanned by the sensing electrodes; and
   means for reading the reference signal and subtracting the reference signal from the output signal when the recording medium is scanned by the sensing electrodes.

6. The apparatus of claim 5, further comprising means for storing a data signal representing respective operation characteristics of the sensing electrodes, and means for multiplying the data signal and an output signal from the subtracting means to compensate a variation among the operation characteristics of the sensing electrodes.

* * * * *